(12) United States Patent
Oka et al.

(10) Patent No.: US 9,672,983 B2
(45) Date of Patent: Jun. 6, 2017

(54) PEEL RESISTANT MULTILAYER WIRING BOARD WITH THIN FILM CAPACITOR AND MANUFACTURING METHOD THEREOF

(75) Inventors: Shuichi Oka, Kanagawa (JP); Shusaku Yanagawa, Kanagawa (JP); Kiwamu Adachi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 129 days.

(21) Appl. No.: 13/480,925

(22) Filed: May 25, 2012

(65) Prior Publication Data

US 2012/0307469 A1 Dec. 6, 2012

(30) Foreign Application Priority Data

Jun. 2, 2011 (JP) .................. 2011-124604

(51) Int. Cl.
| | |
|---|---|
| H05K 1/16 | (2006.01) |
| H01G 4/005 | (2006.01) |
| H01G 4/33 | (2006.01) |
| H01L 23/498 | (2006.01) |
| H01L 21/48 | (2006.01) |
| H05K 3/46 | (2006.01) |

(52) U.S. Cl.
CPC .............. *H01G 4/005* (2013.01); *H01G 4/33* (2013.01); *H01L 21/4857* (2013.01); *H01L 23/49805* (2013.01); *H01L 23/49822* (2013.01); *H05K 1/162* (2013.01); *H01L 2224/16225* (2013.01); *H01L 2224/48091* (2013.01); *H01L 2224/48227* (2013.01); *H01L 2225/1023* (2013.01); *H01L 2225/1058* (2013.01); *H01L 2924/15311* (2013.01); *H01L 2924/15331* (2013.01); *H01L 2924/3011* (2013.01); *H01L 2924/30107* (2013.01); *H05K 3/4652* (2013.01); *Y10T 156/10* (2015.01)

(58) Field of Classification Search
CPC .... H01G 4/33; H01L 23/49805; H05K 1/162; H05K 3/4652
USPC .......................................... 361/777, 760–767
See application file for complete search history.

(56) References Cited

U.S. PATENT DOCUMENTS

| | | | |
|---|---|---|---|
| 7,564,116 B2* | 7/2009 | Ahn et al. ..................... | 257/532 |
| 8,536,463 B2* | 9/2013 | Shoji et al. .................. | 174/260 |
| 2005/0128720 A1* | 6/2005 | Croswell et al. ............. | 361/763 |

(Continued)

FOREIGN PATENT DOCUMENTS

JP 3816508 6/2006

OTHER PUBLICATIONS

Zhao et al., Surface-roughness effect on capacitance and leakage current of an insulating film, Sep. 15, 1999, The American Physical Society, vol. 60 No. 12, pp. 9157-9164.*

*Primary Examiner* — Keith Depew
(74) *Attorney, Agent, or Firm* — Dentons US LLP

(57) ABSTRACT

A multilayer wiring board includes: a functional area which includes a thin film capacitor having a dielectric layer between an upper electrode and a lower electrode; and a peripheral area other than the functional area, wherein a mooring portion in which the dielectric layer and a conductive layer are laminated is provided in at least a portion of the peripheral area, and a roughness of a surface of the conductive layer which contacts the dielectric layer is greater than a roughness of a surface of the upper electrode or the lower electrode which contacts the dielectric layer.

6 Claims, 28 Drawing Sheets

(56) References Cited

U.S. PATENT DOCUMENTS

2007/0146980 A1* 6/2007 Ahn et al. .................... 361/681
2008/0100986 A1* 5/2008 Sohn et al. ................ 361/301.1
2009/0046409 A1* 2/2009 Kweon et al. ................ 361/303
2009/0188703 A1* 7/2009 Ito et al. ....................... 174/255
2013/0088811 A1* 4/2013 Takeshima et al. .......... 361/311

* cited by examiner

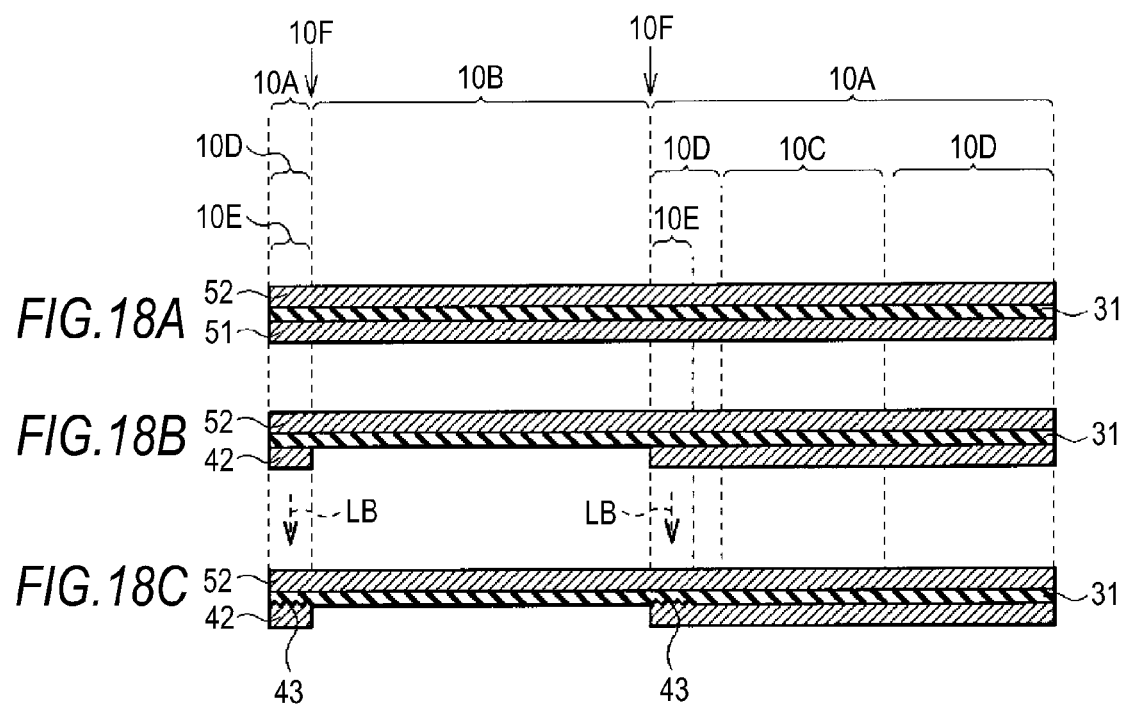

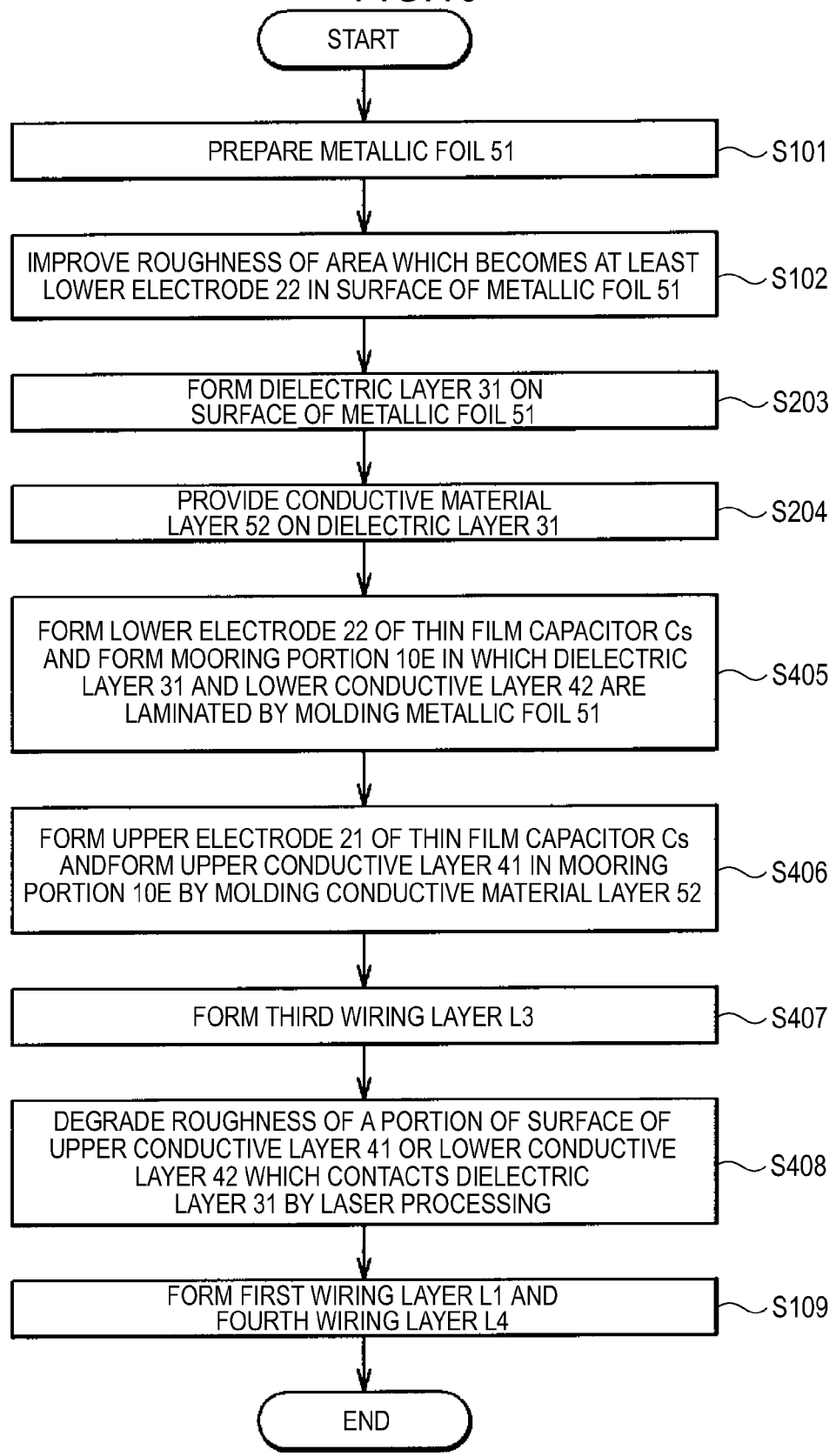

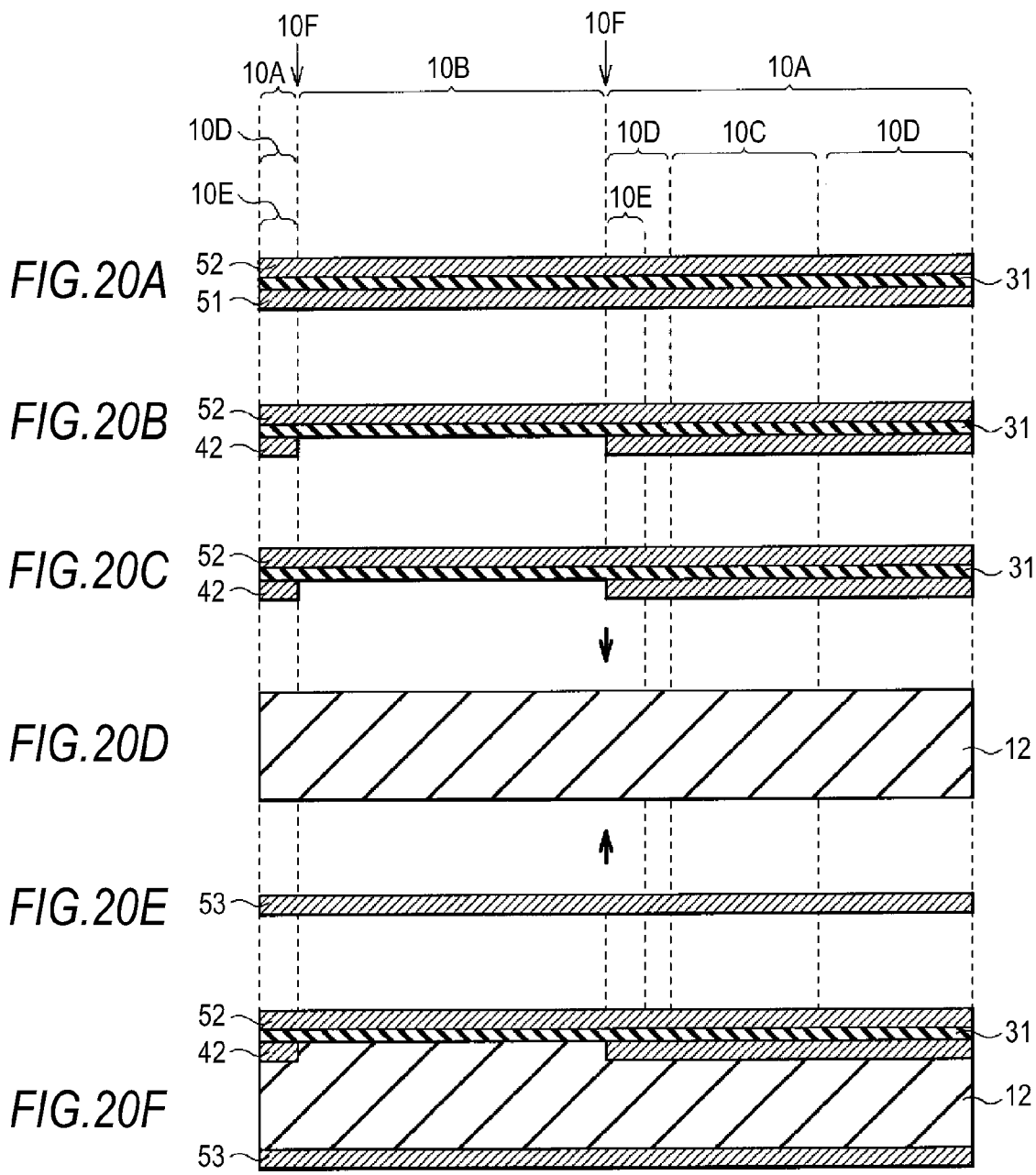

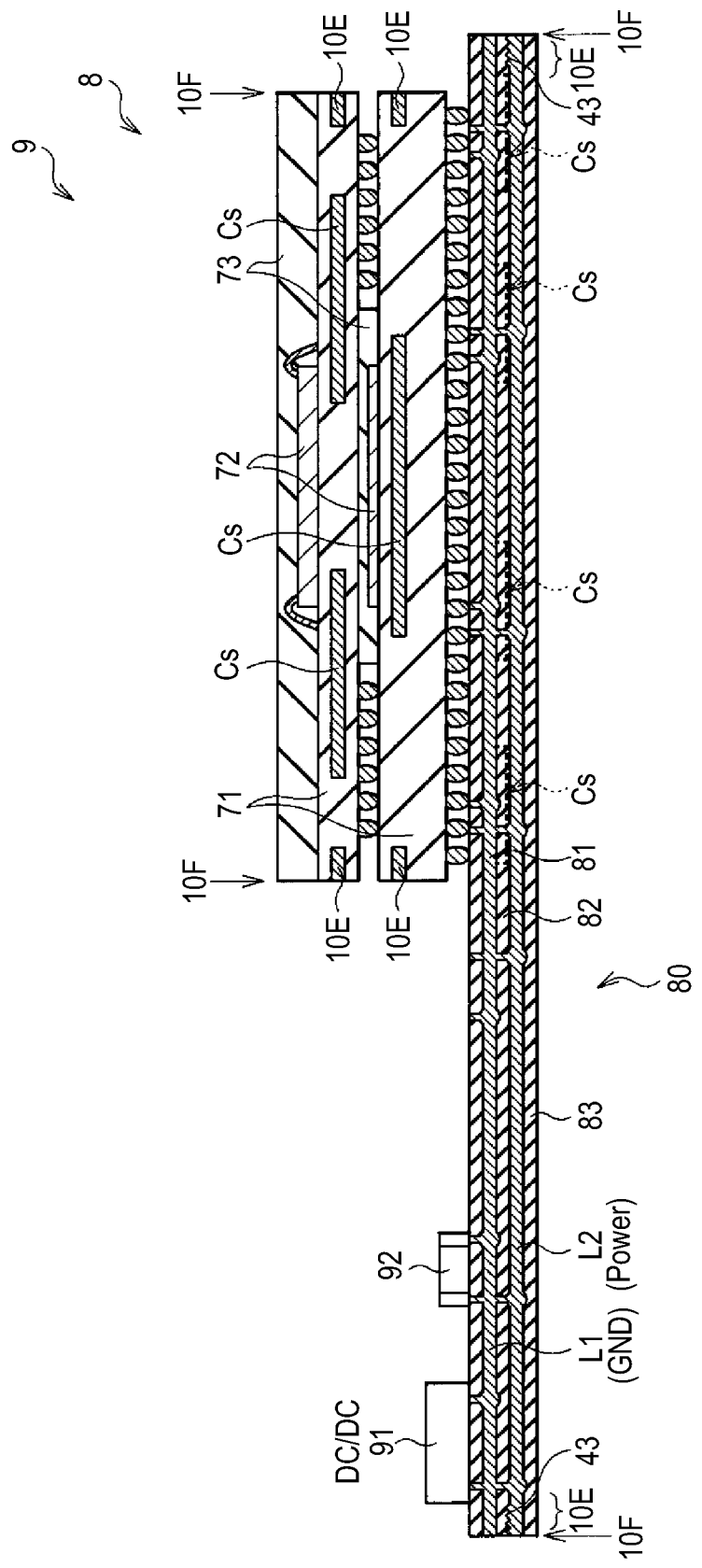

PEEL RESISTANT MULTILAYER WIRING BOARD WITH THIN FILM CAPACITOR AND MANUFACTURING METHOD THEREOF

FIELD

The present disclosure relates to a multilayer wiring board such as a printing wiring board or an interposer substrate, a manufacturing method thereof, and a semiconductor device which includes the multilayer wiring board.

BACKGROUND

In a multilayer wiring board such as a printing wiring board or an interposer substrate, in order to decrease an alternating-current impedance with respect to a ground of a power supply line or to filter a noise component so as not to be transmitted to the subsequent circuit, a surface mount chip capacitor is mounted as a decoupling capacitor (bypass capacitor).

However, in recent years, according to a decrease in a power supply voltage of an active circuit and an increase in consumption current, a demand for suppression of variation in the power supply voltage has become strong. Thereby, influence due to parasitic resistance or parasitic inductance in a lead wiring from the power supply line to the decoupling capacitor easily occurs, and there is a problem in that the decoupling capacitor mounted on the surface of the printing wiring board does not function.

Therefore, a trend which significantly suppresses parasitic impedance by embedding a decoupling capacitor in the printing wiring board or the interposer substrate as a component has been developed. However, in the embedding of the component, there are problems that the substrate is thicker when the component is embedded, the parasitic inductance remains due to a land which is necessary for mounting the component, and the like.

For example, a method for solving the above-described problems is described in Japanese Patent No. 3816508. Japanese Patent No. 3816508 discloses a technology in which a thin film capacitor having a dielectric layer between an upper electrode and a lower electrode is embedded in a printing wiring board.

SUMMARY

However, in Japanese Patent No. 3816508, in the thin film capacitor which is embedded in the substrate, peeling is generated at the interface between electrodes and the dielectric layer due to impact of heating such as a solder reflow in the manufacturing process, heat generated during the use of the product, or the like, and there is a problem in that the life span of the product is shortened.

It is therefore desirable to provide a multilayer wiring board capable of suppressing peeling at an interface between electrodes of a thin film capacitor and a dielectric layer, a manufacturing method thereof, and a semiconductor device including the multilayer wiring board.

An embodiment of the present disclosure is directed to a multilayer wiring board including a functional area which includes a thin film capacitor having a dielectric layer between an upper electrode and a lower electrode, and a peripheral area other than the functional area, wherein a mooring portion in which the dielectric layer and a conductive layer are laminated is provided in at least a portion of the peripheral area, and a roughness of a surface of the conductive layer which contacts the dielectric layer is greater than a roughness of a surface of the upper electrode or the lower electrode which contacts the dielectric layer.

In the embodiment of the present disclosure, the roughness of the conductive layer in the mooring portion is greater than the roughness of the upper electrode or the lower electrode in the functional area. Therefore, the surface of the conductive layer which contacts the dielectric layer becomes rough and the surface area is increased, and adhesiveness between the conductive layer and the dielectric layer is improved. Thereby, the peeling at the interface between the upper electrode or the lower electrode of the thin film capacitor and the dielectric layer in the functional area is suppressed.

Another embodiment of the present disclosure is directed to a method of manufacturing a multilayer wiring board including (A) degrading a roughness of a portion of a surface of a metallic foil, (B) laminating a dielectric layer and a conductive material layer on a surface of the metallic foil in this order, (C) forming a lower electrode of a thin film capacitor and forming a mooring portion on which the dielectric layer and a lower conductive layer are laminated in an area in which the roughness is degraded, by molding the metallic foil, and (D) forming an upper electrode of the thin film capacitor by molding the conductive material layer.

Still another embodiment of the present disclosure is directed to a method of manufacturing a multilayer wiring board including (A) laminating a dielectric layer and a conductive material layer on a surface of a metallic foil in this order, (B) degrading a roughness of a portion of a surface of the metallic foil or the conductive material layer which contacts the dielectric layer by laser processing, (C) forming a lower electrode of a thin film capacitor and forming a mooring portion on which the dielectric layer and a lower conductive layer are laminated in an area in which the roughness is degraded, by molding the metallic foil, and (D) forming an upper electrode of the thin film capacitor and forming an upper conductive layer on the mooring portion, by molding the conductive material layer.

Yet another embodiment of the present disclosure is directed to a method of manufacturing a multilayer wiring board including (A) laminating a dielectric layer and a conductive material layer on a surface of a metallic foil in this order, (B) forming a lower electrode of a thin film capacitor and forming a mooring portion in which the dielectric layer and the lower conductive layer are laminated, by molding the metallic foil, (C) degrading a roughness of a surface of the lower conductive layer or the conductive material layer which contacts the dielectric layer in the mooring portion by laser processing, and (D) forming an upper electrode of the thin film capacitor by molding the conductive material layer.

Still yet another embodiment of the present disclosure is directed to a method of manufacturing a multilayer wiring board including (A) laminating a dielectric layer and a conductive material layer on a surface of a metallic foil in this order, (B) forming a lower electrode of a thin film capacitor and forming a mooring portion in which the dielectric layer and the lower conductive layer are laminated, by molding the metallic foil, (C) forming an upper electrode of the thin film capacitor and forming an upper conductive layer on the mooring portion, by molding the conductive material layer, and (D) degrading a roughness of a surface of the upper conductive layer or the lower conductive layer which contacts the dielectric layer in the mooring portion by laser processing.

Further another embodiment of the present disclosure is directed to a multilayer wiring board including a functional area which includes a thin film capacitor having a dielectric layer between an upper electrode and a lower electrode, and a peripheral area other than the functional area, wherein a mooring portion including the dielectric layer between an upper conductive layer and a lower conductive layer is provided in at least a portion of the peripheral area, and the upper conductive layer and the lower conductive layer penetrate the dielectric layer and are physically connected to each other.

In the multilayer wiring board according to the embodiment of the present disclosure, since the upper conductive layer and the lower conductive layer penetrate the dielectric layer and are physically connected to each other in the mooring portion, adhesiveness between the upper conductive layer and the lower conductive layer is improved. Thereby, the peeling at the interface between the upper electrode or the lower electrode of the thin film capacitor and the dielectric layer in the functional area is suppressed.

Still further another embodiment of the present disclosure is directed to a method of manufacturing a multilayer wiring board including (A) laminating a dielectric layer and a conductive material layer on a surface of a metallic foil in this order, (B) penetrating the dielectric layer by laser processing and physically connecting the metallic foil and the conductive material layer to each other, (C) forming a lower electrode of a thin film capacitor and forming a mooring portion in which the dielectric layer and a lower conductive layer are laminated in an area in which the metallic foil and the conductive material layer are physically connected, by molding the metallic foil, and (D) forming an upper electrode of the thin film capacitor and forming an upper conductive layer in the mooring portion, by molding the conductive material layer.

Yet further another embodiment of the present disclosure is directed to a method of manufacturing a multilayer wiring board including (A) laminating a dielectric layer and a conductive material layer on a surface of a metallic foil in this order, (B) forming a lower electrode of a thin film capacitor and forming a mooring portion in which the dielectric layer and a lower conductive layer are laminated, by molding the metallic foil, (C) penetrating the dielectric layer by laser processing and physically connecting the lower conductive layer and the conductive material layer in the mooring portion to each other, and (D) forming an upper electrode of the thin film capacitor and forming an upper conductive layer in the mooring portion, by molding the conductive material layer.

Still yet further another embodiment of the present disclosure is directed to a method of manufacturing a multilayer wiring board including (A) laminating a dielectric layer and a conductive material layer on a surface of a metallic foil in this order, (B) forming a lower electrode of a thin film capacitor and forming a mooring portion in which the dielectric layer and a lower conductive layer are laminated, by molding the metallic foil, (C) forming an upper electrode of the thin film capacitor and forming an upper conductive layer in the mooring portion, by molding the conductive material layer, and (D) penetrating the dielectric layer by laser processing and physically connecting the upper conductive layer and the lower conductive layer in the mooring portion to each other.

A further embodiment of the present disclosure is directed to a semiconductor device including a chip and the multilayer wiring board according to the embodiment of the present disclosure.

Since the semiconductor device according to the embodiment of the present disclosure includes the multilayer wiring board according to the embodiment of the present disclosure, the peeling at the interface between the upper electrode or the lower electrode of the thin film capacitor and the dielectric layer in the functional area is suppressed, and life span of the product is lengthened.

According to the multilayer wiring board of the embodiment of the present disclosure, the roughness of the conductive layer in the mooring portion is greater than the roughness of the upper electrode or the lower electrode of the thin film capacitor in the functional area. Therefore, adhesiveness between the conductive layer and the dielectric layer in the mooring portion is improved, and the peeling at the interface between the upper electrode or the lower electrode of the thin film capacitor and the dielectric layer in the functional area can be suppressed. Accordingly, when the semiconductor device includes the multilayer wiring board, the life span of the product can be lengthened.

According to the method of manufacturing a multilayer wiring board of the embodiment of the present disclosure, the dielectric layer and the conductive material layer are laminated in this order after a roughness of a portion of the surface of the metallic foil is degraded, the lower electrode of the thin film capacitor is formed and the mooring portion on which the dielectric layer and the lower conductive layer are laminated is formed in the area in which the roughness is degraded due to the fact that the metallic foil is molded. Thereby, the multilayer wiring board according to the embodiment of the present disclosure can be easily manufactured.

According to the method of manufacturing a multilayer wiring board of the embodiment of the present disclosure, the dielectric layer and the conductive material layer are laminated on the surface of the metallic foil in this order and the roughness of a portion of the metallic foil or the conductive material layer is degraded by laser processing. Thereafter, the lower electrode of the thin film capacitor is formed and the mooring portion on which the dielectric layer and the lower conductive layer are laminated is formed in the area in which the roughness is degraded due to the fact that the metallic foil is molded. Thereby, the multilayer wiring board according to the embodiment of the present disclosure can be easily manufactured.

According to the method of manufacturing a multilayer wiring board of the embodiment of the present disclosure, the dielectric layer and the conductive material layer are laminated on the surface of the metallic foil in this order, the lower electrode of the thin film capacitor is formed and the mooring portion in which the dielectric layer and the lower conductive layer are laminated is formed due to the fact that the metallic foil is molded. Thereafter, the roughness of the lower conductive layer or the conductive material layer in the mooring portion is degraded by laser processing. Thereby, the multilayer wiring board according to the embodiment of the present disclosure can be easily manufactured.

According to the method of manufacturing a multilayer wiring board of the embodiment of the present disclosure, the roughness of a surface of the upper conductive layer or the lower conductive layer which contacts the dielectric layer in the mooring portion is degraded by laser processing after the thin film capacitor is formed. Thereby, the multilayer wiring board according to the embodiment of the present disclosure can be easily manufactured.

According to the multilayer wiring board of the embodiment of the present disclosure, the upper conductive layer and the lower conductive layer penetrate the dielectric layer and are physically connected to each other in the mooring portion. Therefore, the adhesiveness between the upper conductive layer and the lower conductive layer in the mooring portion is improved, and the peeling at the interface between the upper electrode or the lower electrode of the thin film capacitor and the dielectric layer in the functional area can be suppressed. Accordingly, when the semiconductor device includes the multilayer wiring board, the life span of the product can be lengthened.

According to the method of manufacturing a multilayer wiring board of the embodiment of the present disclosure, the dielectric layer and the conductive material layer are laminated on the surface of the metallic foil in this order, the dielectric layer is penetrated by laser processing, the metallic foil and the conductive material layer are physically connected to each other, thereafter, the lower electrode of the thin film capacitor is formed, and the mooring portion in which the dielectric layer and the lower conductive layer are laminated is formed in the area in which the metallic foil and the conductive material layer are physically connected. Thereby, the multilayer wiring board according to the embodiment of the present disclosure can be easily manufactured.

According to the method of manufacturing a multilayer wiring board of the embodiment of the present disclosure, the dielectric layer and the conductive material layer are laminated on the surface of the metallic foil in this order, and the lower electrode of the thin film capacitor is formed and the mooring portion in which the dielectric layer and the lower conductive layer are laminated is formed due to the fact that the metallic foil is molded. Thereafter, the dielectric layer is penetrated by laser processing and the lower conductive layer and the conductive material layer are physically connected to each other in the mooring portion. Thereby, the multilayer wiring board according to the embodiment of the present disclosure can be easily manufactured.

According to the method of manufacturing a multilayer wiring board of the embodiment of the present disclosure, after the thin film capacitor is formed, the dielectric layer is penetrated by laser processing and the upper conductive layer and the lower conductive layer are physically connected to each other in the mooring portion. Thereby, the multilayer wiring board according to the embodiment of the present disclosure can be easily manufactured.

BRIEF DESCRIPTION OF THE DRAWINGS

FIGS. 18A to 18C are cross-sectional views illustrating the manufacturing method shown in FIG. 17 in the order of processes.

FIG. 19 is a flow diagram showing a method of manufacturing a multilayer wiring board according to a fifth embodiment of the present disclosure.

FIGS. 20A to 20F are cross-sectional views illustrating the manufacturing method shown in FIG. 19 in the order of processes.

FIG. 32 is a cross-sectional view showing a configuration of a semiconductor device according to a ninth embodiment of the present disclosure.

DETAILED DESCRIPTION

Hereinafter, embodiments of the present disclosure will be described in detail with reference to drawings. Moreover, the descriptions are performed in the following order.

1. First Embodiment (Multilayer Wiring Board; Example in Which Mooring Portion Due To Roughness Degradation Is Provided Along Outline)
2. Second Embodiment (Multilayer Wiring Board; Example In Which Mooring Portion Due To Roughness Degradation Is Provided To Enclose Through-Via)
3. Third Embodiment (Method Of Manufacturing Multilayer Wiring Board; Example In Which Roughness Of Metallic Foil or Conductive Material Layer Is Degraded After Dielectric Layer And Conductive Material Layer Are Laminated On Metallic Foil)
4. First Modification (Multilayer Wiring Board; Example In Which Roughness of Upper Conductive Layer of Mooring Portion Is Greater Than Roughness of Upper Electrode Or Lower Electrode)
5. Second Modification (Multilayer Wiring Board: Example In Which Roughness Of Both Upper Conductive Layer And Lower Conductive Layer Of Mooring Portion Is Greater Than Roughness Of Upper Electrode Or Lower Electrode)
6. Fourth Embodiment (Method Of Manufacturing Multilayer Wiring Board; Example In Which Roughness of Lower Conductive Layer Or Conductive Material Layer Is Degraded After Metallic Foil Is Molded And Lower Conductive Layer Is Formed)
7. Fifth Embodiment (Method Of Manufacturing Multilayer Wiring Board; Example In Which Roughness of Upper Conductive Layer Or Lower Conductive Layer Is Degraded After Thin Film Capacitor Is Embedded)
8. Third Modification (Method Of Manufacturing Multilayer Wiring Board; Example In Which Roughness of Upper Conductive Layer Or Lower Conductive Layer Is Degraded After Multilayer Wiring Board Is Completed)
9. Sixth Embodiment (Multilayer Wiring Board; Example In Which Upper Conductive Layer And Lower Conductive Layer Penetrate Dielectric Layer And Are Connected To Each Other)
10. Fourth Modification (Multilayer Wiring Board; Example In Which Roughness of Upper Conductive Layer And Lower Conductive Layer Are Degraded And Upper Conductive Layer And Lower Conductive Layer Are Connected To Each Other Through Dielectric Layer)
11. Seventh Embodiment (Multilayer Wiring Board; Example Of Interposer Substrate In Which Thin Film Capacitor Is Embedded)
12. Eighth Embodiment (Multilayer Wiring Board; Example In Which Interposer Substrates Are Superposed In Multiple Stages)
13. Ninth Embodiment (Semiconductor Device; Example In Which Multilayer Wiring Board Is Used As Main Board)

(First Embodiment)

Figure 1:
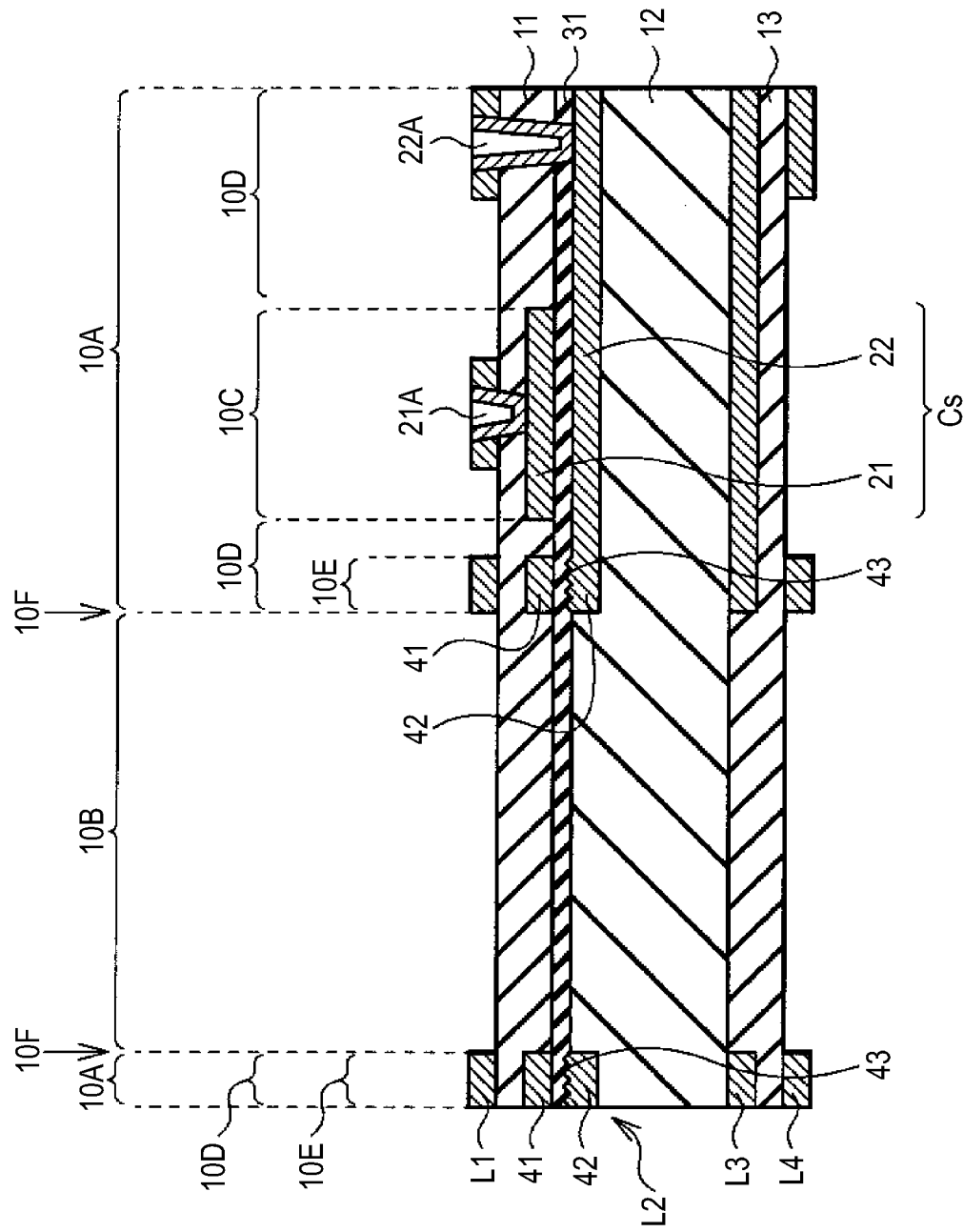
FIG. 1 is a cross-sectional view showing a configuration of a multilayer wiring board according to a first embodiment of the present disclosure.

FIG. 1 shows a cross-sectional configuration of a multilayer wiring board according to a first embodiment of the present disclosure. The multilayer wiring board is used as a printing wiring board or an interposer substrate. For example, the multilayer wiring board is a four-layer printed substrate in which a first wiring layer L1 configured of a copper (Cu) foil, a second wiring layer L2 including a thin film capacitor Cs described below, a third wiring layer L3 configured of a copper foil, and a fourth wiring layer L4 configured of a copper foil are laminated between resin layers 11, 12, and 13.

Moreover, in the multilayer wiring board, a substrate area 10A which is used as a printing wiring board or an interposer substrate and a machining area 10B for performing a physical machining and cutting such as dicing or router processing are provided. In a portion of the substrate area 10A, a functional area 10C in which a thin film capacitor is embedded is provided. Areas other than the functional area 10C become a peripheral area 10D which does not contribute to a capacitor. A mooring portion 10E is provided in a portion of the peripheral area 10D.

In the functional area 10C, a capacitor is not mounted on the multilayer wiring board as a component, and instead of this, the thin film capacitor is embedded in the substrate 10A. A thin film capacitor is embedded in the printing wiring board or the interposer substrate, and therefore, a decoupling capacitor may be disposed just below an integrated circuit (IC).

For example, the functional area 10C includes a thin film capacitor Cs which has a dielectric layer 31 between an upper electrode 21 and a lower electrode 22 instead of the copper foil of the second wiring layer L2 described above. Through-vias 21A and 22A each are connected to the upper electrode 21 and the lower electrode 22 of the thin film capacitor Cs.

For example, the upper electrode 21 is formed of a metallic foil such as copper (Cu). Moreover, the upper electrode 21 may include a conductive layer which is formed by plating, sputtering, vapor disposition, or the like in addition to the metallic foil.

The constituent material of the dielectric layer 31 is not particularly limited. For example, the constituent material may include strontium-barium titanate (BST) (BaSrTiO), barium titanate (BTO) ($BaTiO_3$), strontium titanate (STO) ($SrTiO_3$), or the like.

For example, the lower electrode 22 is formed of a metallic foil such as a nickel (Ni) foil. A surface of the lower electrode 22 which contacts the dielectric layer 31 is planarized by lapping and polishing, or the like. A roughness of the surface is preferably Rz 0.1 µm or less. The reason is because deterioration in the pressure resistance or leakage of current can be suppressed even though the thickness of the dielectric layer 31 is thin and a capacitance value per unit area of the thin film capacitor Cs can be enhanced.

The thickness of the upper electrode 21 is several micrometers (µm) to several tens of micrometers (µm), the thickness of the dielectric layer 31 is about 1 µm, and the thickness of the lower electrode 22 is 10 µm to 100 µm. Accordingly, the thickness of the thin film capacitor Cs can be thinned in a near-digit compared to the capacitor which is a component. Moreover, since the thin film capacitor Cs includes a layered configuration of the upper electrode (conductive layer) 21/the dielectric layer 31/the lower electrode (conductive layer) 22 similar to a double-sided copper clad laminated sheet, the thin film capacitor has improved compatibility with a standard substrate process, and there is an advantage in that a land for mounting components may not be required.

The mooring portion 10E includes a dielectric layer 31 between an upper conductive layer 41 of the same layer as the upper electrode 21 and a lower conductive layer 42 of the same layer as the lower electrode 22, and the configuration of the layer is the same as that of the thin film capacitor Cs of the functional area 10C. However, a roughness of a surface of the lower conductive layer 42 which contacts the dielectric layer 31 is at least Rz 4 µm, for example, is preferably Rz 8 µm, and is greater than the roughness of the surface which contacts the dielectric layer 31 of the lower electrode 22. In other words, the surface of the lower conductive layer 42 which contacts the dielectric layer 31 is a coarse surface portion 43, the roughness of which is greater than that of the surface which contacts the dielectric layer 31 of the lower electrode 22. Thereby, in the multilayer wiring board, peeling at an interface between the upper electrode 21 or the lower electrode 22 of the thin film capacitor Cs and the dielectric layer 31 can be suppressed.

That is, there is a problem in that the capacitance value per unit area of the thin film capacitor is smaller compared to that of the capacitor which is a component. The capacitance value per unit area which can be realized by the thin film capacitor is several microfarads (μF) per square centimeter. In order to improve the capacitance value per unit area, it is necessary to increase the relative permittivity of the dielectric layer or thin the thickness of the dielectric layer.

In order to increase the relative permittivity of the dielectric layer, it is effective to change the material of the dielectric layer. However, in the thin film capacitor, since strontium titanate, barium titanate, barium strontium titanate, or the like which is a ferroelectric film already used in the capacitor which is a component is used, significant improvement in the relative permittivity may not be expected.

On the other hand, in the thickness of the dielectric layer, in theory, since the capacitance value is increased inversely proportional to the thickness of the dielectric layer, thinning the dielectric layer is significantly effective. However, in actual fact, since unevenness is present in the conductive layer, by simply thinning the thickness of the dielectric layer, influence in a portion in which the thickness of the dielectric layer is locally thinned is increased. Thereby, significant deterioration in pressure resistance and significant increase in leaked current occur.

Therefore, before the dielectric layer is formed, due to the fact that the roughness is improved by grinding the surface of the conductive layer or the like, the portion in which the thickness of the dielectric layer is locally thinned can be removed and the thickness of the dielectric film can be thinned.

However, as adverse effects against the improvement of the surface roughness of the conductive layer, adhesiveness between the conductive layer and the dielectric layer is decreased. The decrease in the adhesiveness between the conductive layer and the dielectric layer increases a risk of generating a peeling phenomenon in the interface. The peeling phenomenon of the interface increases gaps between the electric capacitance designed as a capacitor, and the design quality is not satisfied. Moreover, the peeling becomes a starting point for occurrence of delamination in the printing wiring board or the interposer substrate, interlayer separation is generated by subjection to impact of heating such as solder reflow, peeling occurs due to the heat which is generated during the use of the product, and thereby, there is a problem in that the life span of the product is shortened.

Thus, in the present embodiment, the roughness of the surface of the lower conductive layer 42 which contacts the dielectric layer 31 in the mooring portion 10E is greater than the roughness of the surface of the lower electrode 22 of the thin film capacitor Cs which contacts the dielectric layer 31 in the functional area 10C. Thereby, an anchoring (mooring) function which improves the adhesiveness between the lower conductive layer 42 and the dielectric layer 31 is provided in the mooring portion 10E, and the peeling at the interface between the upper electrode 21 or the lower electrode 22 of the thin film capacitor Cs and the dielectric layer 31 can be suppressed in the functional area 10C.

Figure 2:
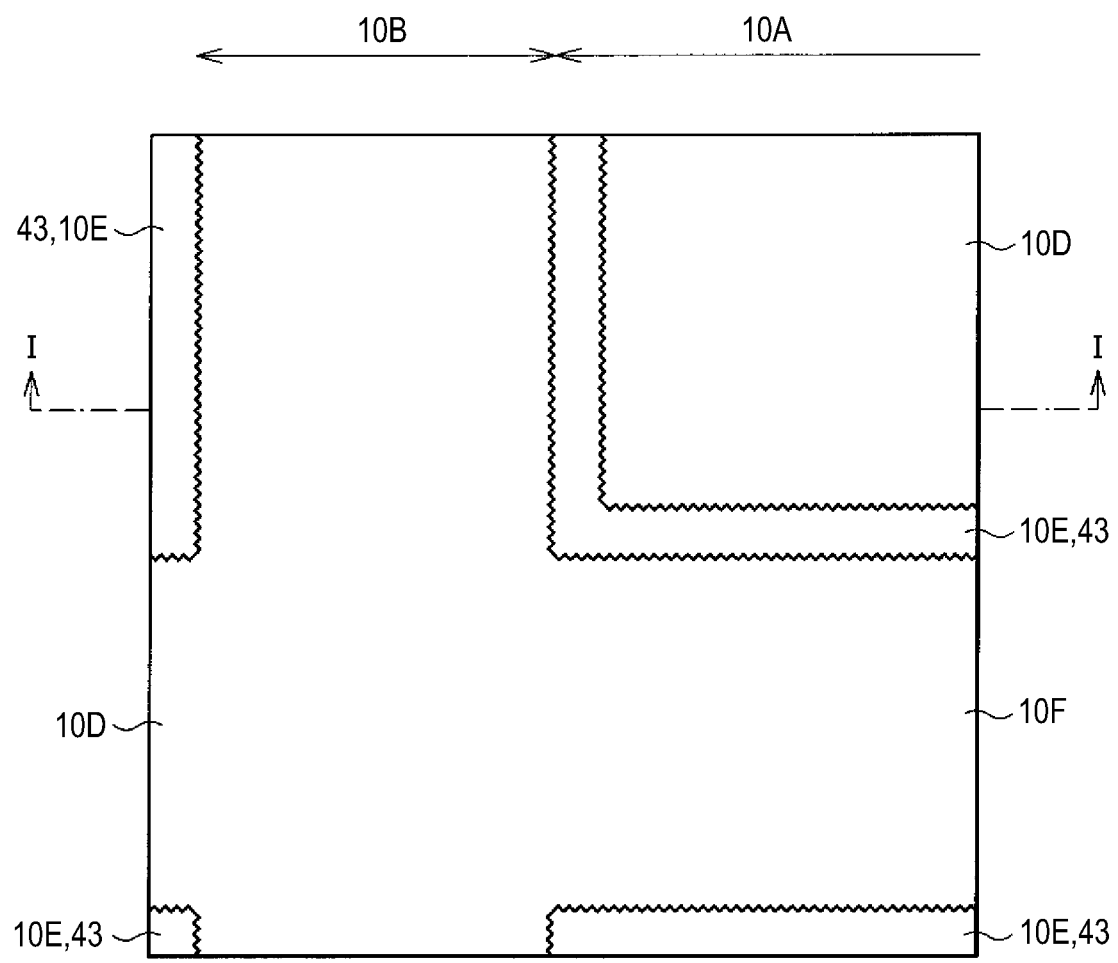
FIG. 2 is a plan view of the multilayer wiring board show in FIG. 1.

As shown in FIG. 2, it is preferable that the mooring portion 10E be provided along an outline 10F, that is, a boundary line between the substrate area 10A and the machining area 10B. The outline 10F corresponds to edges of the printing wiring board or the interposer substrate and is an area which is subjected to damage due to physical cutting such as dicing or router processing. The portion of the outline 10F is one of places having the greatest risk in which the peeling may be generated at the interface between the upper electrode 21 or the lower electrode 22 of the thin film capacitor Cs and the dielectric layer 31. Accordingly, due to the fact that the mooring portion 10E is provided along the outline 10F, the effect suppressing the peeling at the interface between the upper electrode 21 and the lower electrode 22 of the thin film capacitor Cs and the dielectric layer 31 can be further increased.

The upper conductive layer 41 and the lower conductive layer 42 each are formed of the same material as that of the upper electrode 21 and the lower electrode 22. The upper conductive layer 41 and the lower conductive layer 42 each may be provided so as to be continuous with (be a common layer with) the upper electrode 21 and the lower electrode 22, and may be discontinuous with (be a layer separated from) the upper electrode 21 and the lower electrode 22.

The dielectric layer 31 may be provided so as to be a common layer with (be one continuous phase with) the functional area 10C and the peripheral area 10D. The reason is because the processing in the apparatus which is present in a general manufacturing line of the multilayer wiring board is difficult.

For example, the multilayer wiring board may be manufactured as follows.

Figure 3:
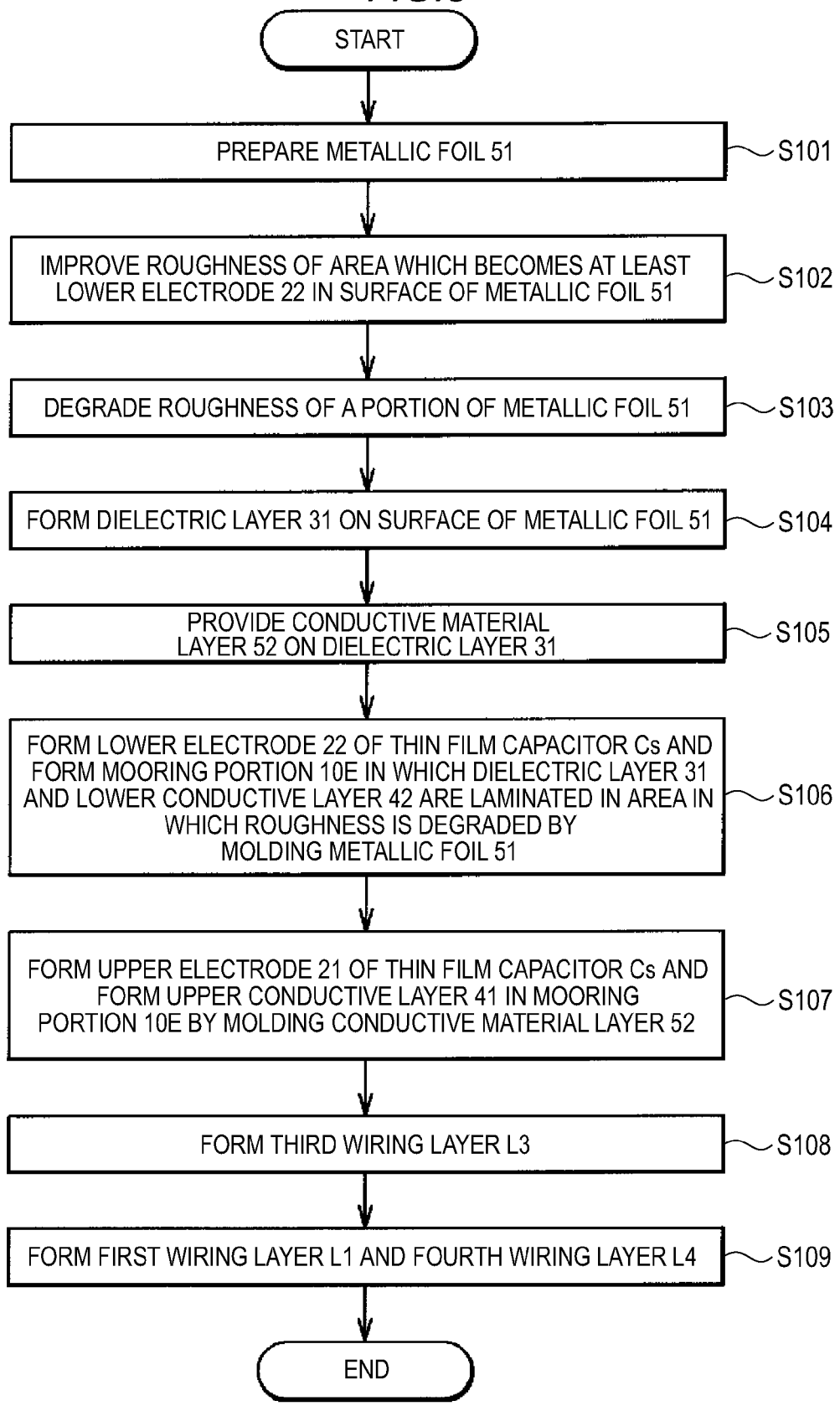
FIG. 3 is a flow diagram showing a method of manufacturing the multilayer wiring board shown in FIG. 1.
Figure 4:
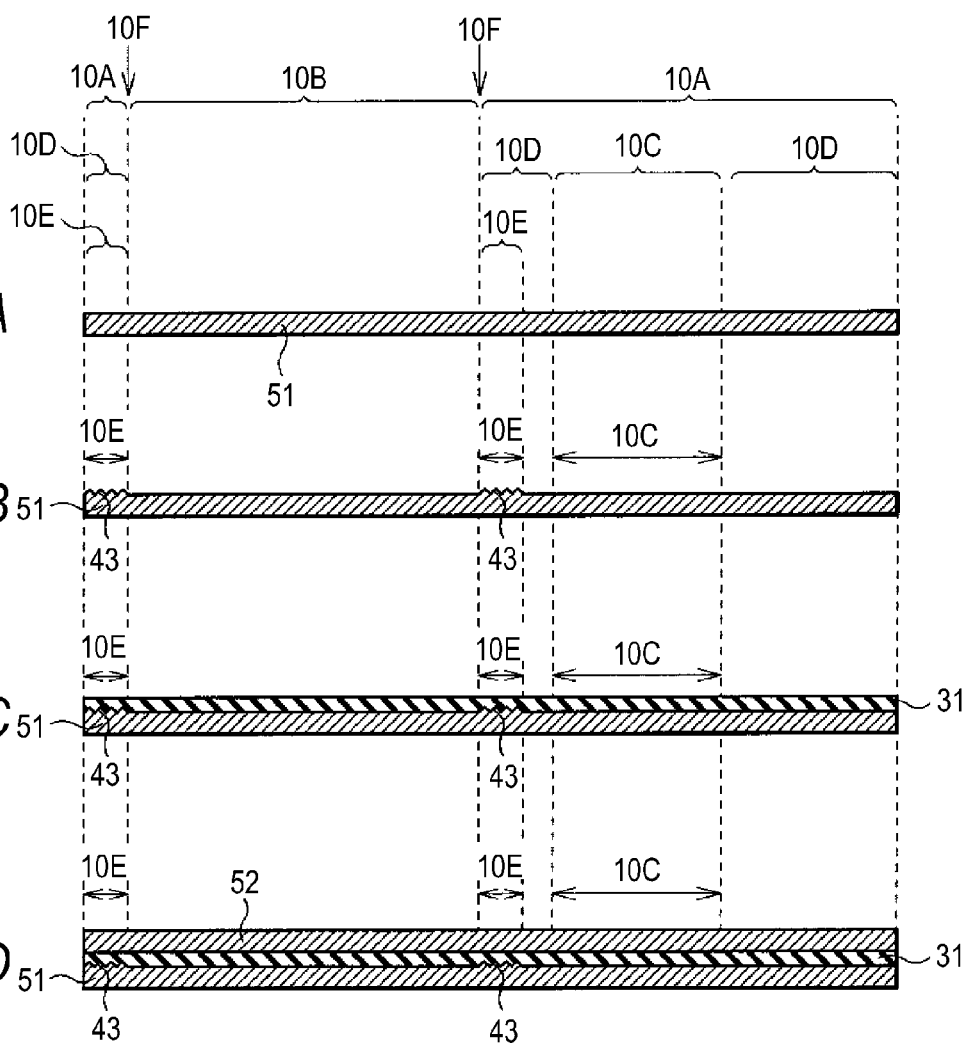
FIGS. 4A to 4D are cross-sectional views illustrating the manufacturing method shown in FIG. 3 in the order of processes.
Figure 5:
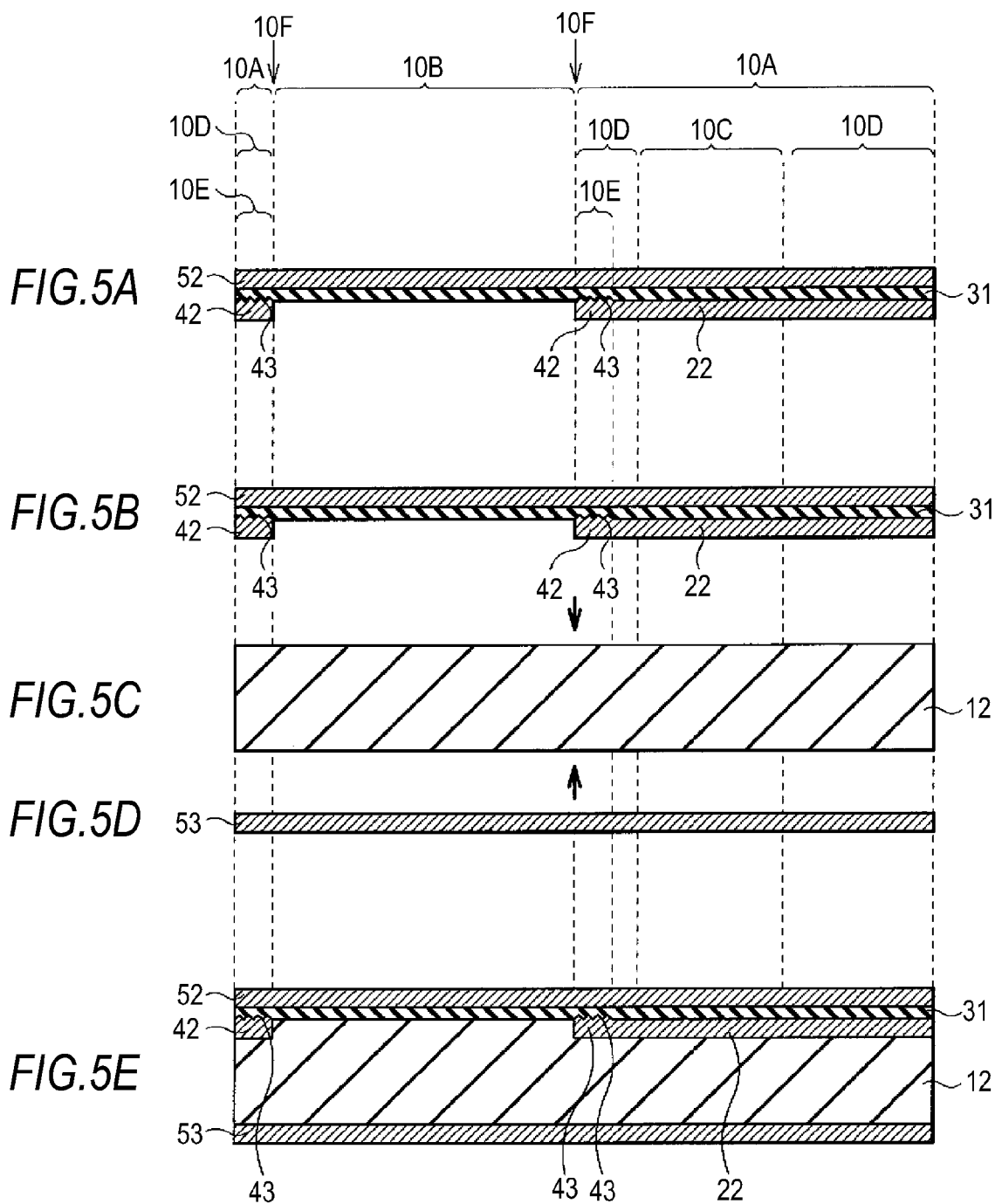
FIGS. 5A to 5E are cross-sectional views showing processes continuing to FIGS. 4A to 4D.
Figure 6:
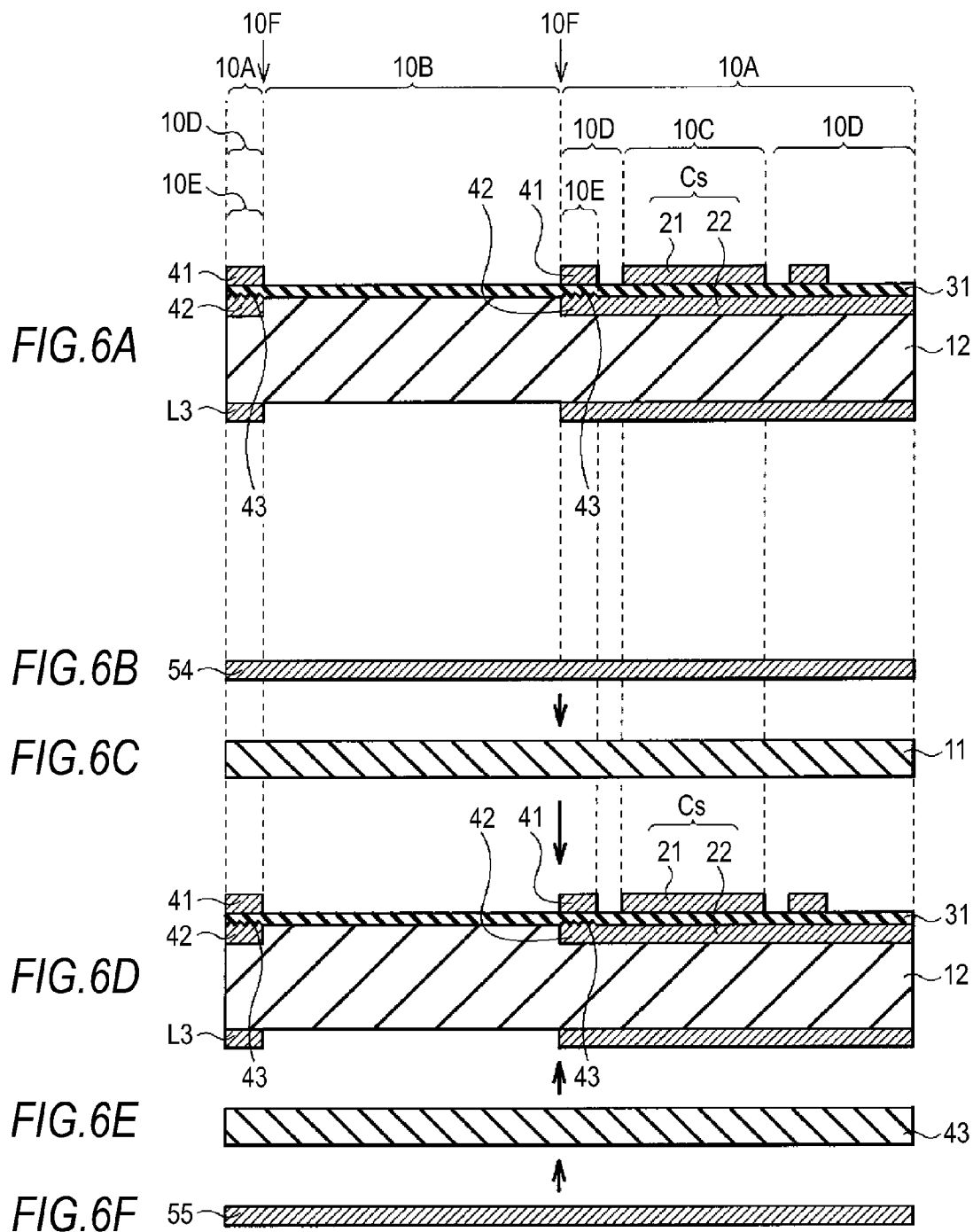
FIGS. 6A to 6F are cross-sectional views showing processes continuing to FIGS. 5A to 5E.
Figure 7:
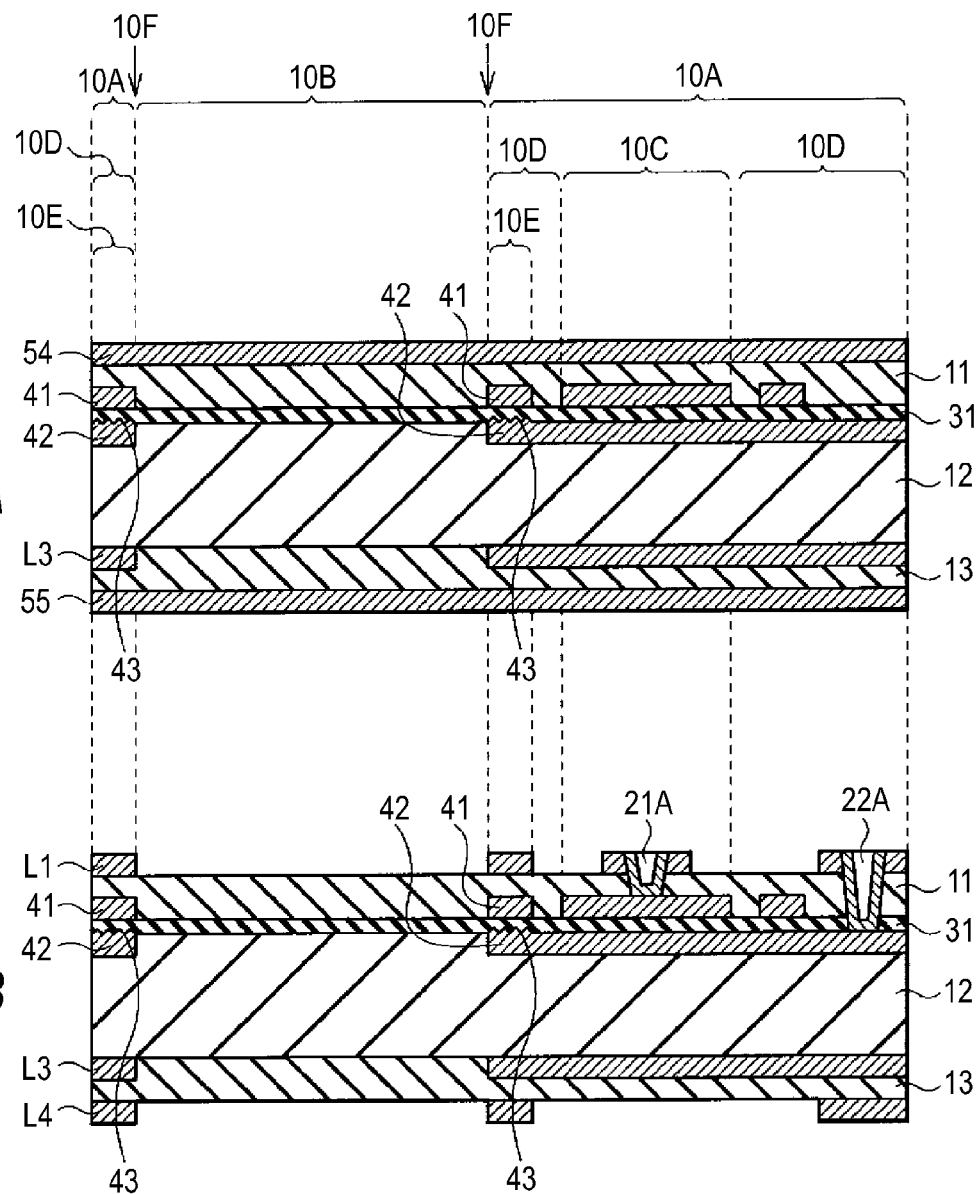
FIGS. 7A and 7B are cross-sectional views showing processes continuing to FIGS. 6A to 6F.

FIG. 3 is a flow diagram showing the method of manufacturing the multilayer wiring board, and FIGS. 4A to 7B illustrate the manufacturing method shown in FIG. 3 in the order of processes. First, as shown in FIG. 4A, a metallic foil 51 such as a nickel foil is prepared as the constituent material of the lower electrode 22 and the lower conductive layer 42 (step S101).

Subsequently, as shown in FIG. 4A, a planarization processing is performed with respect to the surface of the metallic foil 51 by lapping and polishing or the like, and the surface roughness is improved (step S102). For example, it is preferable that the surface roughness of the metallic foil 51 be Rz 0.1 μm or less. Thereby, the roughness of the area which becomes the lower electrode 22 in the functional area 10C is improved, and the capacitance value per unit area of the thin film capacitor Cs can be improved.

Subsequently, as shown in FIG. 4B, the roughness of a portion of the metallic foil 51, specifically, the roughness of a portion of the peripheral area 10D which does not contribute to the thin film capacitor Cs is degraded (step S103). For example, the roughness is at least Rz 4 μm, and is preferably Rz 8 μm. Thereby, the roughness of the area which becomes the lower conductive layer 42 of the mooring portion 10E is greater (rougher) than the roughness of the area which becomes the lower electrode 22 of the functional area 10C, and the coarse surface portion 43 is formed.

For example, as a method which degrades the roughness of a portion of the metallic foil 51, a laser radiation (laser processing) may be used. Moreover, for example, a method may be used in which the metallic foil 51 is covered with a dry film photoresist, an opening is provided in a portion of the metallic foil 51 by patterning, and the roughness of a portion of the metallic foil 51 is degraded by coarsening processing using a chemical solution.

Subsequently, as shown in FIG. 4C, the dielectric layer 31 is provided on the entire surface of the metallic foil 51 (step S104). As a method of forming the dielectric layer 41, for example, a so-called sol-gel method, a coating method which forms a dielectric layer by coating using a dielectric filler containing-resin solution containing a dielectric filler and a binder resin, a method which laminates films containing a dielectric filler, sputtering, and vapor deposition, and various known methods can be adopted.

Thereafter, as shown in FIG. 4D, a conductive material layer 52 is provided so as to form the upper electrode 21 and the upper conductive layer 41 on the dielectric layer 31 (step S105). As a method of forming the conductive material layer 52, a method which bonds a metal foil, a method which forms the conductive material layer 52 by plating, sputtering, and vapor deposition, and various known methods can be adopted.

After the conductive material layer 52 is provided on the dielectric layer 31, for example, the metallic foil 51 is molded in a predetermined shape by etching, more specifically, by wet etching, and therefore, the metallic foil 51 of the machining area 10B is selectively removed and the metallic foil 51 remains only on the substrate area 10A. Thereby, as shown in FIG. 5A, the lower electrode 22 of the thin film capacitor Cs is formed on the functional area 10C, and the mooring portion 10E in which the dielectric layer 31 and the lower conductive layer 42 are laminated is formed in the area in which the roughness is degraded (step S106).

After the lower electrode 22 and the mooring portion 10E are formed, as shown in FIGS. 5B to 5E, a metallic foil 53 is bonded onto the rear surface of the lower electrode 22 and the lower conductive layer 42 while interposing the resin layer 12 in order to form the third wiring layer L3.

After the metallic foil 53 is bonded, as shown in FIG. 6A, for example, the conductive material layer 52 is molded in a predetermined shape by etching, and therefore, the upper electrode 21 of the thin film capacitor Cs is formed on the functional area 10C and the upper conductive layer 41 is formed on the mooring portion 10E (step S107). Thereby, the thin film capacitor Cs including the dielectric layer 31 between the upper electrode 21 and the lower electrode 22 is formed in the functional area 10C, and the mooring portion 10E including the dielectric layer 31 between the upper conductive layer 41 and the lower conductive layer 42 is formed in a portion of the peripheral area 10D.

At the same time, as shown in FIG. 6A, the metallic foil 53 is molded in a predetermined shape, and therefore, the third wiring layer L3 is formed (step S108).

After the metallic foils 51 and 53 are molded, as shown in FIGS. 6B to 6D, a metallic foil 54 is bonded onto the upper electrode 21 and the upper conductive layer 41 while interposing the resin layer 11 in order to form the first wiring layer L1. Moreover, as shown FIGS. 6E to 6F and FIG. 7A, a metallic foil 55 is bonded onto the rear surface of the third wiring layer L3 while interposing the resin layer 13 in order to form the fourth wiring layer L4.

After the metallic foils 54 and 55 are bonded, as shown in FIG. 7B, for example, the metallic foils 54 and 55 are molded in a predetermined shape by etching, and therefore, the first wiring layer L1 and the fourth wiring layer L4 are formed (step S109).

Finally, as shown in FIG. 7B, for example, the through-vias 21A and 22A are connected to the upper electrode 21 and the lower electrode 22 respectively of the thin film capacitor Cs by laser processing. From the above, the multilayer wiring board shown in FIG. 1 is completed.

In the multilayer wiring board, the roughness of the surface of the lower conductive layer 42 which contacts the dielectric layer 31 in the mooring portion 10E is greater than the roughness of the surface which contacts the dielectric layer 31 of the lower electrode 22 in the functional area 10C. Thereby, the surface of the lower conductive layer 42 which contacts the dielectric layer 31 is rough and the surface area is increased, and therefore, the adhesiveness between the lower conductive layer 42 and the dielectric layer 31 is improved. Thereby, the peeling at the interface between the upper electrode 21 and the lower electrode 22 of the thin film capacitor Cs and the dielectric layer 31 is suppressed in the functional area 10C.

In addition, the surface of the lower electrode 22 which contacts the dielectric layer 31 is planarized by lapping and polishing, or the like, and for example, the roughness of the surface of the lower electrode 22 is Rz 0.1 μm or less. Therefore, deterioration in the pressure resistance or leakage of current is suppressed even though the thickness of the dielectric layer 31 is thin. Thereby, the capacitance value per unit area of the thin film capacitor Cs is improved.

Figure 8:
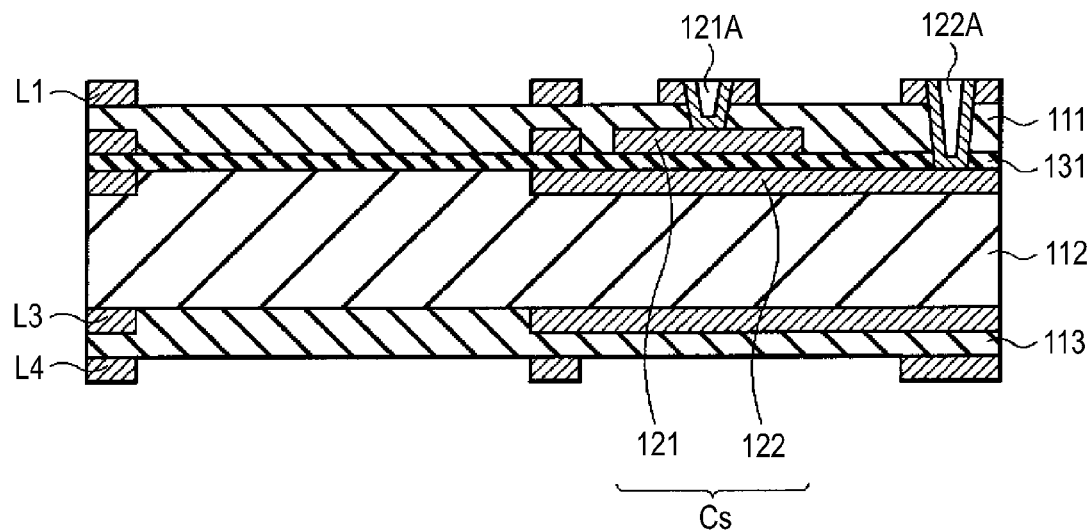
FIG. 8 is a cross-sectional view showing a configuration of a multilayer wiring board in the related art.

On the other hand, for example, as shown in FIG. 8, when the mooring portion 10E is not provided and the roughness of an upper electrode 121 and a lower electrode 122 is improved in order to increase the capacitance of the thin film capacitor, as adverse effects of the roughness improvement, the adhesiveness between the upper electrode 121 or the lower electrode 122 and the dielectric layer 131 is decreased. The decrease in the adhesiveness between the upper electrode 121 or the lower electrode 122 and the dielectric layer 131 increases the risk of generating the peeling phenomenon at the interface. The peeling phenomenon of the interface increases gaps between the electric capacitance designed as a capacitor, and the design quality is not satisfied. Moreover, the peeling becomes a starting point for occurrence of delamination of the printing wiring board or the interposer substrate, interlayer separation is generated by subjection to impact of heating such as solder reflow, or peeling occurs due to the heat which is generated during the use of the product and the life span of the product is shortened. In FIG. 8, the components corresponding to those in FIG. 1 are denoted by the same reference numerals prefixed with 1.

In this way, in the present embodiment, the roughness of the surface of the lower conductive layer 42 which contacts the dielectric layer 31 in the mooring portion 10E is greater than the roughness of the surface of the lower electrode 22 of the thin film capacitor Cs which contacts the dielectric layer 31 in the functional area 10C. Thereby, the adhesiveness between the lower conductive layer 42 and the dielectric layer 31 is improved in the mooring portion 10E, and the peeling at the interface between the upper electrode 21 or the lower electrode 22 of the thin film capacitor Cs and the dielectric layer 31 can be suppressed in the functional area 10C.

Moreover, since the mooring portion 10E is provided along the outline 10F, that is, the boundary line between the substrate area 10A and the machining area 10B, the substrate area 10A is protected from damage due to physical cutting such as dicing or router processing, and effects which suppress the peeling at the interface between the upper electrode 21 or the lower electrode 22 of the thin film capacitor Cs and the dielectric layer 31 can be further increased.

In addition, in the embodiment, the case where the mooring portion 10E is disposed along the outline 10F is described. However, it is not necessary to dispose the mooring portion 10E in the outline 10F. For example, the mooring portion 10E may be provided only in the periphery of the functional area 10C which contributes to the thin film capacitor Cs, and may be provided in the entire peripheral area 10D which contributes to the thin film capacitor Cs in addition to the functional area 10C.

Moreover, in the manufacturing method of the present embodiment, the case where the surface roughness of the metallic foil 51 is improved in the first place is described. However, the gist of the present embodiment is the following. That is, the roughness of the lower electrode 22 of the functional area 10C which contributes to the thin film capacitor Cs is improved so as to realize high capacitance by thinning the dielectric layer 31, the mooring portion 10E in which the roughness of the lower conductive layer 42 is rough is provided in at least a portion of the peripheral area 10D which does not contribute to the thin film capacitor Cs, and the necessary adhesiveness is obtained. Accordingly, when the initial roughness of the metallic foil 51 is sufficiently improved, the effects of the present embodiment can be sufficiently obtained only by degrading the roughness of a portion of the surface of the metallic foil 51 without performing the improvement process of the surface roughness of the metallic foil 51.

Moreover, when the initial roughness of the metallic foil 51 is rough enough to obtain the sufficient adhesiveness, the effects of the present embodiment can be sufficiently obtained by selectively improving the roughness of only the area which becomes the lower electrode 22 of the functional area 10C contributing to the thin film capacitor Cs. As a method of selectively improving the roughness of the area which becomes the lower electrode 22, for example, only the area of the metallic foil 51 which becomes the lower electrode 22 is exposed by dry film patterning, and the roughness of the exposed portion can be improved by electric field polishing or the like. Alternatively, the selective polishing can be performed by methods other than the selective electric polishing.

(Second Embodiment)

Figure 9:
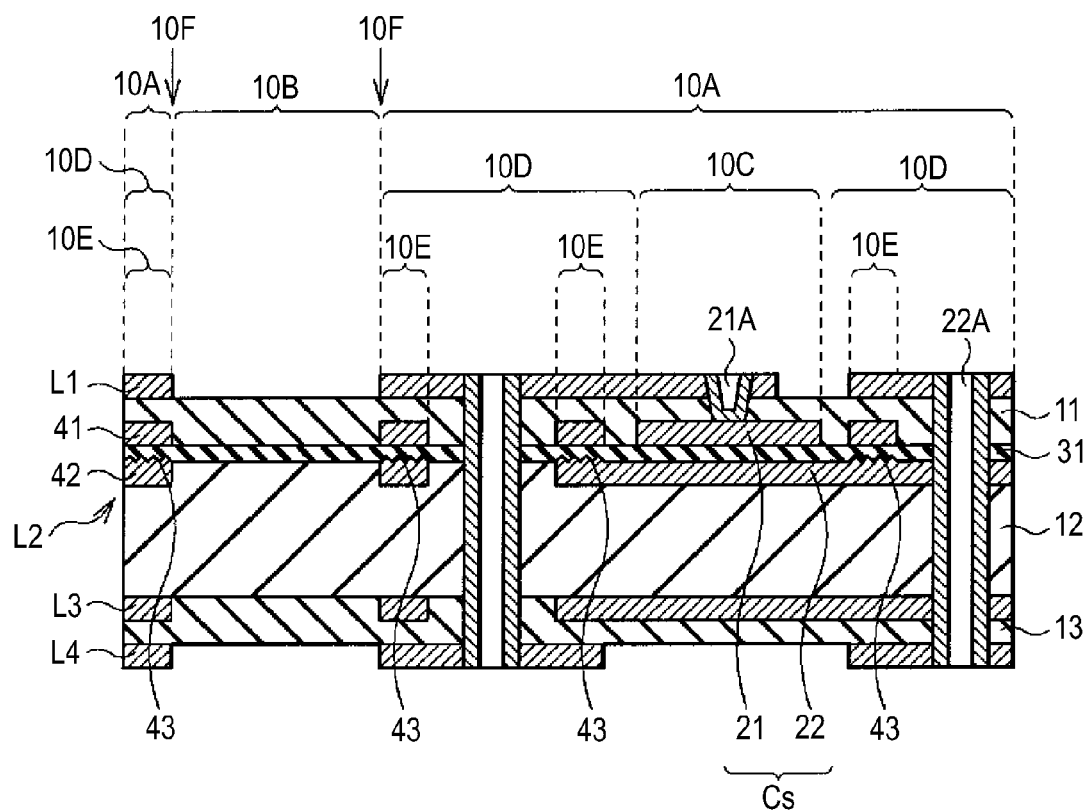
FIG. 9 is a cross-sectional view showing a configuration of a multilayer wiring board according to a second embodiment of the present disclosure.
Figure 10:
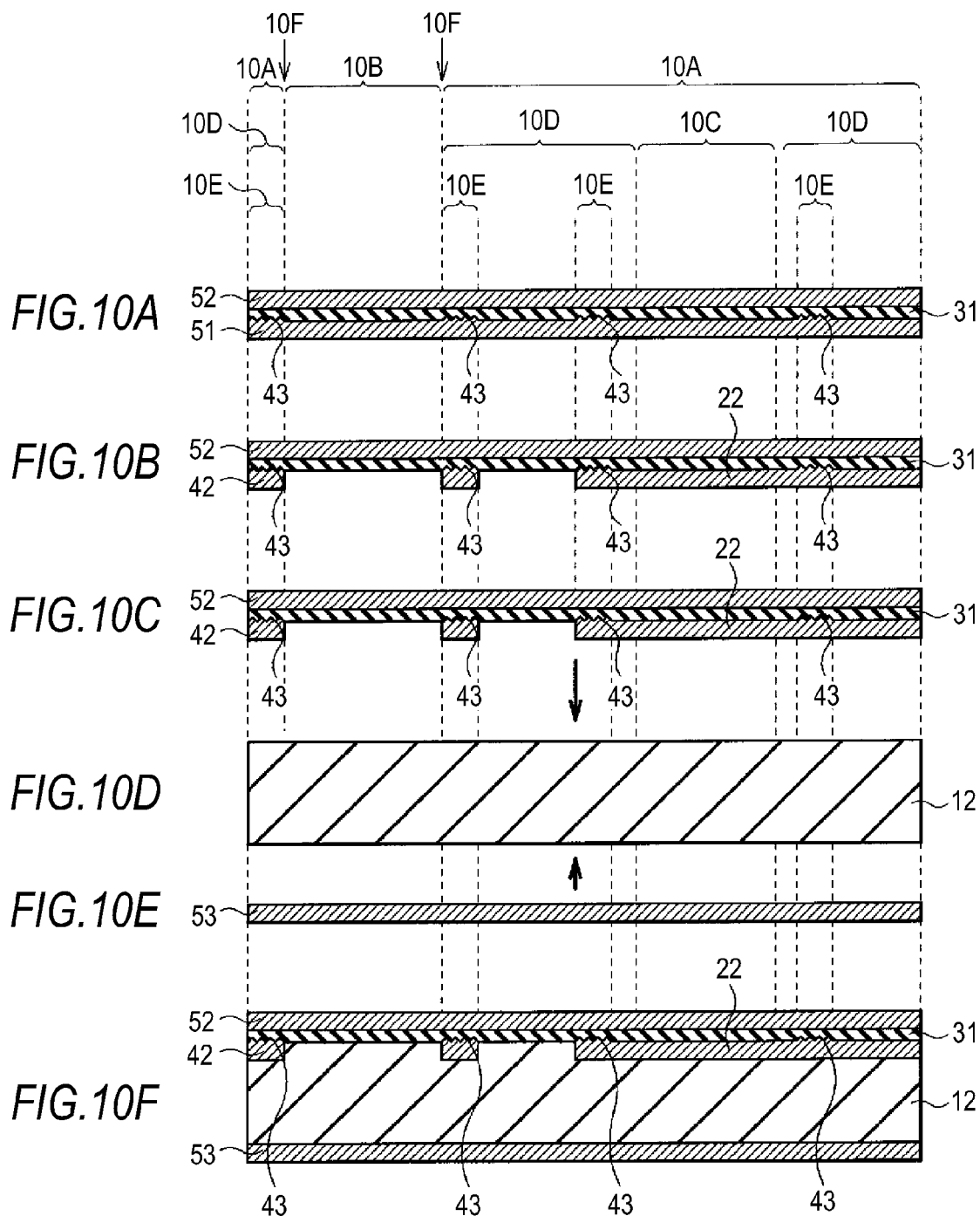
FIGS. 10A to 10F are cross-sectional views illustrating a method of manufacturing the multilayer wiring board shown in FIG. 9 in the order of processes.
Figure 11:
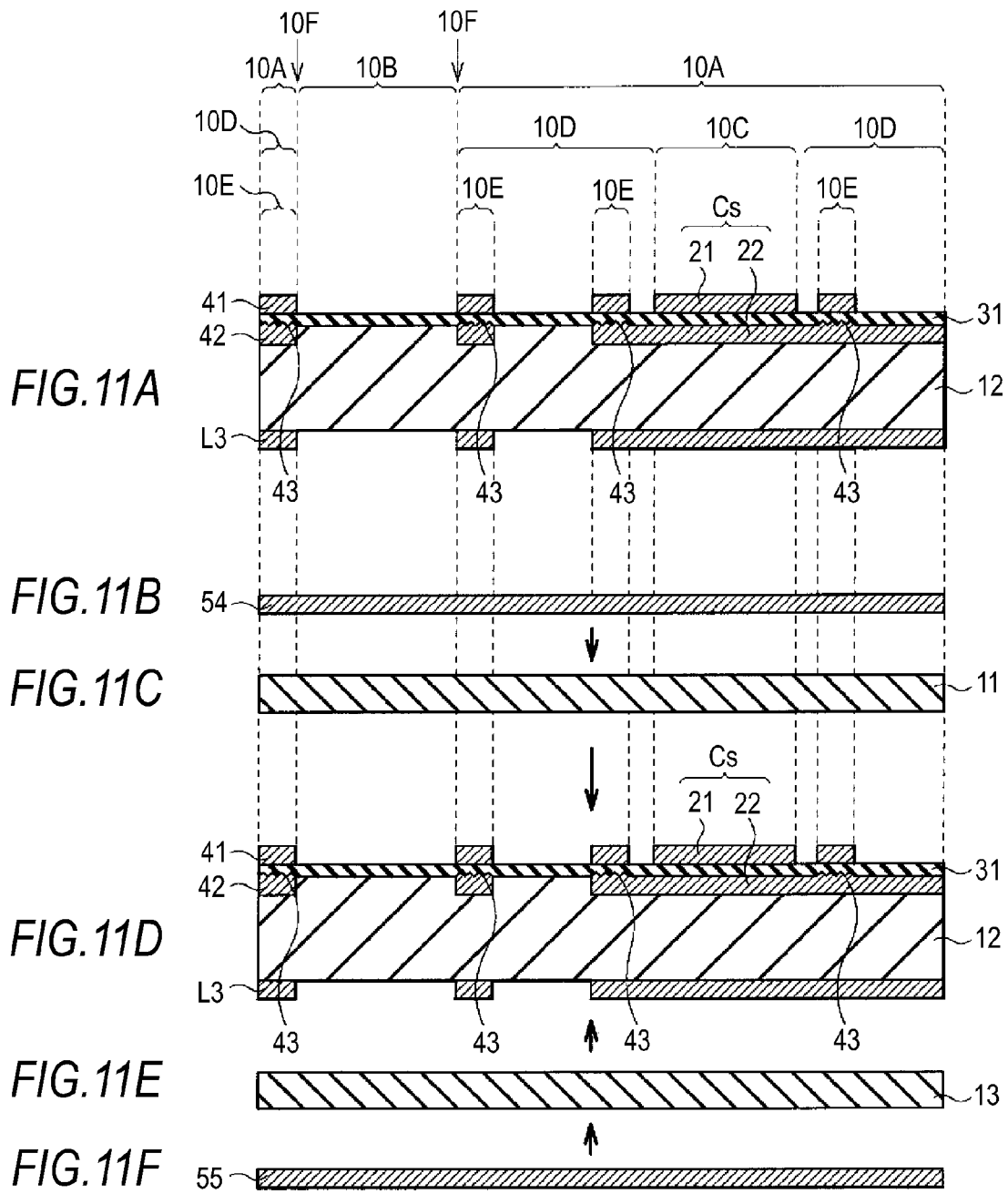
FIGS. 11A to 11F are cross-sectional views showing processes continuing to FIGS. 10A to 10F.
Figure 12:
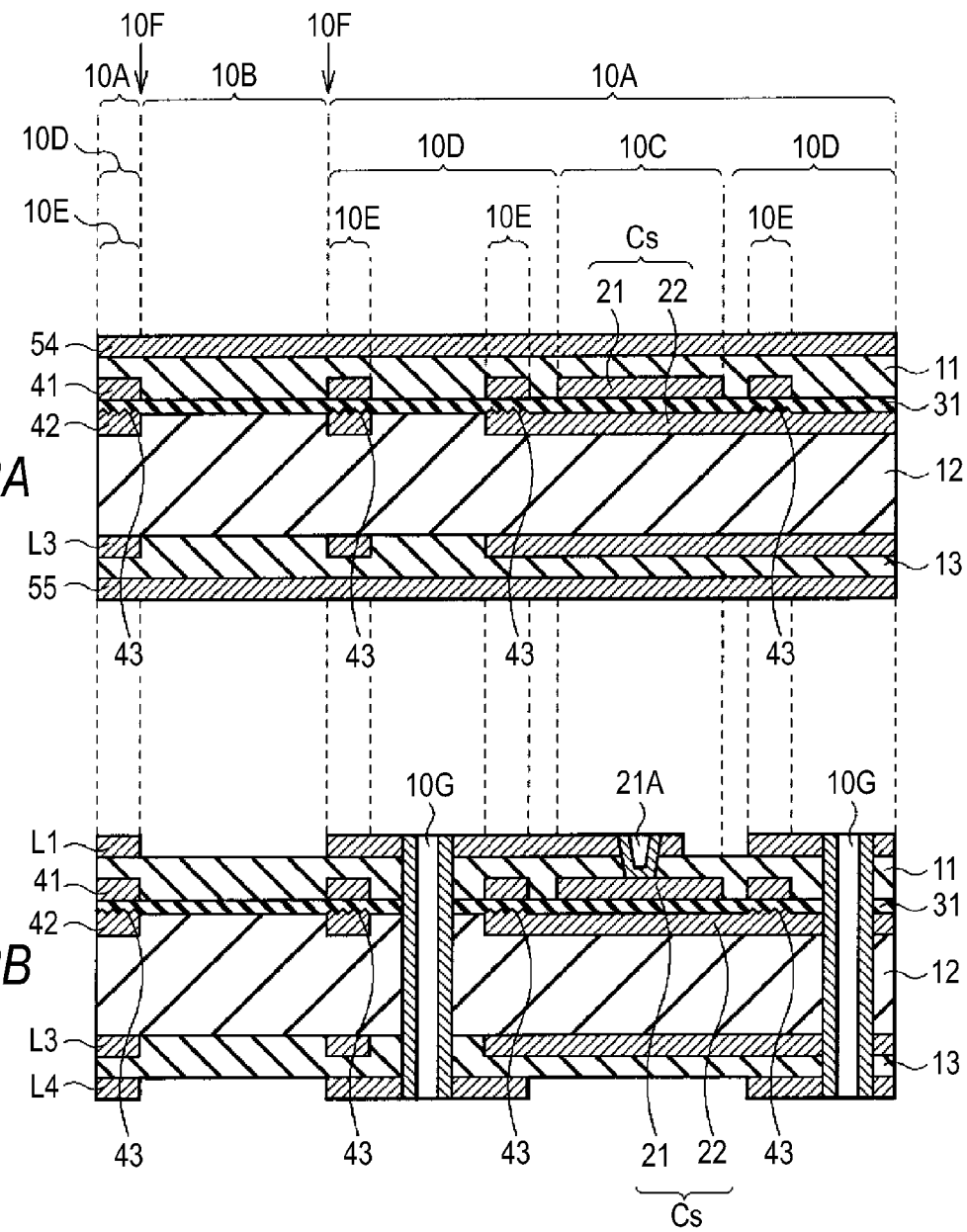
FIGS. 12A and 12B are cross-sectional views showing processes continuing to FIGS. 11A to 11F.

FIG. 9 shows a cross-sectional configuration of a multilayer wiring board according to a second embodiment of the present disclosure. In the multilayer wiring board, the mooring portion 10E is provided so as to enclose a through-hole 10G of the peripheral area 10D in addition to the outline 10F. Except for this, the multilayer wiring board of the second embodiment includes the same configuration, operation and effects as those of the first embodiment. Thereby, the corresponding components are denoted by the same reference numerals.

The through-hole 10G is a drilled through-hole which is provided so as to penetrate the multilayer wiring board in the entire lamination direction. The periphery of the through-hole 10G is an area which is exposed to the physical cutting through the drilling processing, and also is one of places having the greatest risk in which the peeling phenomenon may occur at the interface between the conductive layer of the thin film capacitor and the dielectric layer. Accordingly, the mooring portion 10E is disposed so as to enclose the through-hole 10G, and therefore, the effects which suppress the peeling at the interface between the upper electrode 21 and the lower electrode 22 of the thin film capacitor Cs and the dielectric layer 31 can be further increased.

For example, the multilayer wiring board may be manufactured as follows.

FIGS. 10A to 12B show the manufacturing method of the multilayer wiring board in the order of processes. In addition, since the flow of the manufacturing method is similar to that of the first embodiment, the following description will be performed with reference to the steps of FIG. 3. Moreover, the processes overlapping with those of the first embodiment will be described with reference to FIGS. 4A to 4D.

First, similar to the first embodiment, according to the process shown in FIG. 4A, the metallic foil 51 such as a nickel foil is prepared as the constituent material of the lower electrode 22 and the lower conductive layer 42 (step S101).

Subsequently, similar to the first embodiment, according to the process shown in FIG. 4A, a planarization processing is performed with respect to the surface of the metallic foil 51 by lapping and polishing or the like, and the surface roughness is improved (step S102).

Subsequently, similar to the first embodiment, according to the process shown in FIG. 4B, as shown in FIG. 10A, the roughness of a portion of the metallic foil 51, specifically, the roughness of a portion of the peripheral area 10D which does not contribute to the thin film capacitor Cs is degraded (step S103). Thereby, the roughness of the area which becomes the lower conductive layer 42 of the mooring portion 10E is greater (rougher) than the roughness of the area which becomes the lower electrode 22 of the functional area 10C, and the coarse surface portion 43 is formed.

Subsequently, similar to the first embodiment, according to the process of FIG. 4C, as shown in FIG. 10A, the dielectric layer 31 is provided on the entire surface of the metallic foil 51 (step S104).

Thereafter, similar to the first embodiment, according to the process shown in FIG. 4D, as shown in FIG. 10A, a conductive material layer 52 is provided so as to form the upper electrode 21 and the upper conductive layer 41 on the dielectric layer 31 (step S105).

After the conductive material layer 52 is provided on the dielectric layer 31, for example, the metallic foil 51 is molded in a predetermined shape by etching, and therefore, the metallic foil 51 of the machining area 10B and the area in which the through-hole 10G is to be formed is selectively removed. Thereby, as shown in FIG. 10B, the lower electrode 22 of the thin film capacitor Cs is formed on the functional area 10C, and the mooring portion 10E in which the dielectric layer 31 and the lower conductive layer 42 are laminated is formed in the area in which the roughness is degraded (step S106).

After the lower electrode 22 and the mooring portion 10E are formed, as shown in FIGS. 10C to 10F, a metallic foil 53 is bonded onto the rear surface of the lower electrode 22 and the lower conductive layer 42 while interposing the resin layer 12 in order to form the third wiring layer L3.

After the metallic foil 53 is bonded, as shown in FIG. 11A, for example, the conductive material layer 52 is molded in a predetermined shape by etching, and therefore, the upper electrode 21 of the thin film capacitor Cs is formed on the functional area 10C and the upper conductive layer 41 is formed on the mooring portion 10E (step S107). Thereby, the thin film capacitor Cs including the dielectric layer 31 between the upper electrode 21 and the lower electrode 22 is formed in the functional area 10C, and the mooring portion 10E including the dielectric layer 31 between the upper conductive layer 41 and the lower conductive layer 42 is formed in a portion of the peripheral area 10D.

At the same time, as shown in FIG. 11A, the metallic foil 53 is molded in a predetermined shape, and therefore, the third wiring layer L3 is formed (step S108).

After the metallic foils 51 and 53 are molded, as shown in FIGS. 11B to 11D, a metallic foil 54 is bonded onto the upper electrode 21 and the upper conductive layer 41 while interposing the resin layer 11 in order to form the first wiring layer L1. Moreover, as shown in FIGS. 11D to 11F and FIG. 12A, a metallic foil 55 is bonded onto the rear surface of the third wiring layer L3 while interposing the resin layer 13 in order to form the fourth wiring layer L4.

After the metallic foils 54 and 55 are bonded, as shown in FIG. 12B, for example, the metallic foils 54 and 55 are molded in a predetermined shape by etching, and therefore, the first wiring layer L1 and the fourth wiring layer L4 are formed (step S109).

Finally, as shown in FIG. 12B, for example, the through-via 21A is connected to the upper electrode 21 of the thin film capacitor Cs by laser processing. Moreover, the through-hole 10G is provided by drilling processing. From the above, the multilayer wiring board shown in FIG. 9 is completed.

In the multilayer wiring board, the mooring portion 10E is provided so as to enclose the through-hole 10G of the peripheral area 10D in addition to the outline 10F. The peeling at the interface between the upper electrode 21 and the lower electrode 22 of the thin film capacitor Cs and the dielectric layer 31 can be suppressed more reliably.

In the second embodiment, in addition to the effects of the first embodiment, since the mooring portion 10E is provided so as to enclose the through-hole 10G of the peripheral area 10D, the effect which suppresses the peeling at the interface between the upper electrode 21 and the lower electrode 22 of the thin film capacitor Cs and the dielectric layer 31 can be further increased.

In addition, in the embodiment, the case where the mooring portion 10E is disposed along the outline 10F and is disposed so as to enclose the through-hole 10G of the peripheral area 10D is described. However, it is not necessary to dispose the mooring portion 10E in the outline 10F and the periphery of the through-hole 10G. For example, the mooring portion 10E may be provided only in the periphery of the functional area 10C which contributes to the thin film capacitor Cs, and may be provided in the entire peripheral area 10D which contributes to the thin film capacitor Cs in addition to the functional area 10C.

(Third Embodiment)

Figure 13:
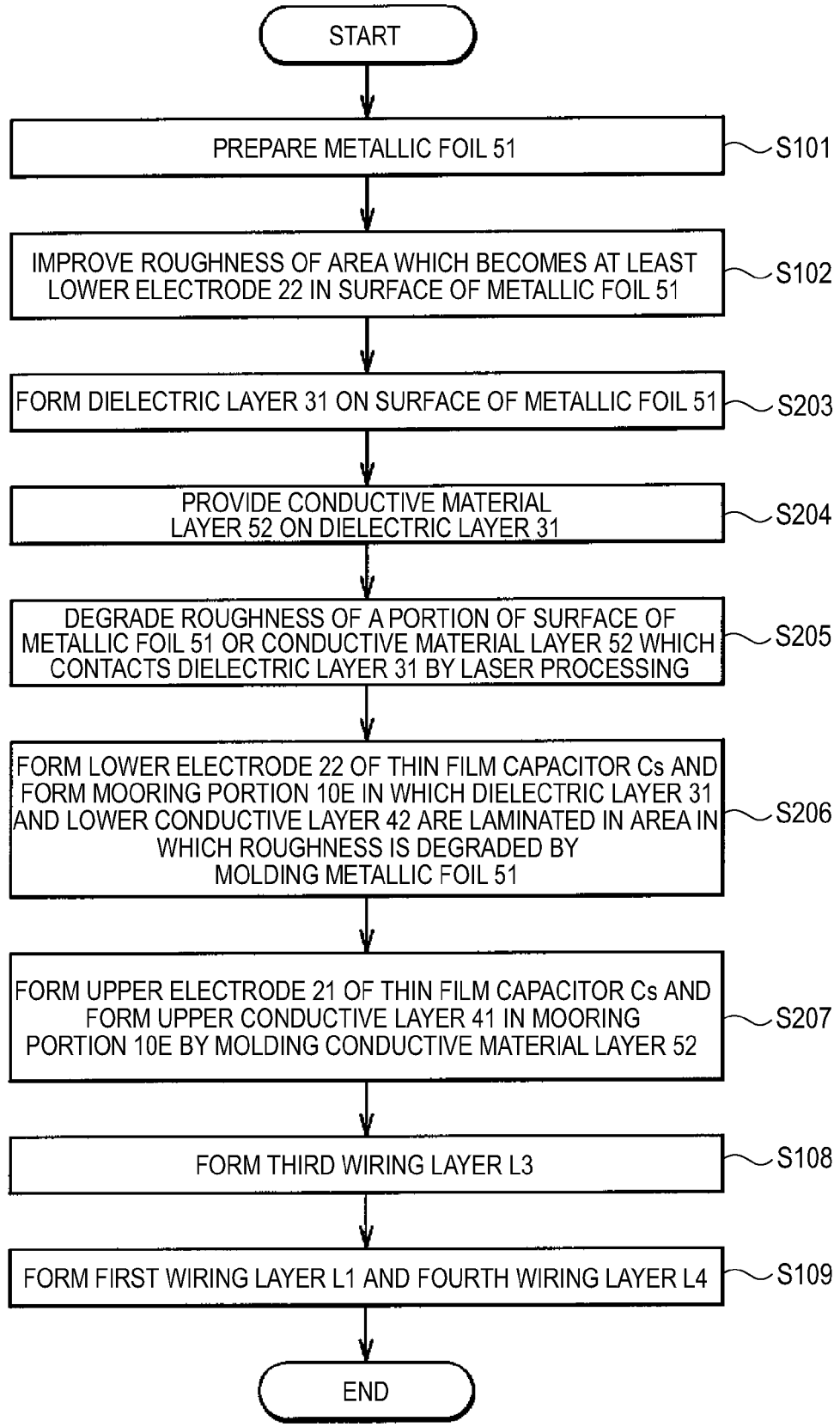
FIG. 13 is a flow diagram showing a method of manufacturing a multilayer wiring board according to a third embodiment of the present disclosure.

FIG. 13 is a flow diagram showing a method of manufacturing a multilayer wiring board according to a third embodiment of the present disclosure and FIGS. 14A to 14D show the manufacturing method shown in FIG. 13 in the order of processes. This manufacturing method is different from that of the first embodiment in that the roughness degradation process is performed by laser processing after the dielectric layer 31 and the conductive material layer 52 are laminated on the metallic foil 51. Moreover, the processes overlapping with those of the first embodiment will be described with reference to FIGS. 4A to 7B. In addition, this manufacturing method is not limited to the case where the multilayer wiring board of the first embodiment is manufactured. However, in the description below, for example, the case where the mooring portion 10E is provided along the outline 10F like the first embodiment will be described as the example.

Figure 14:
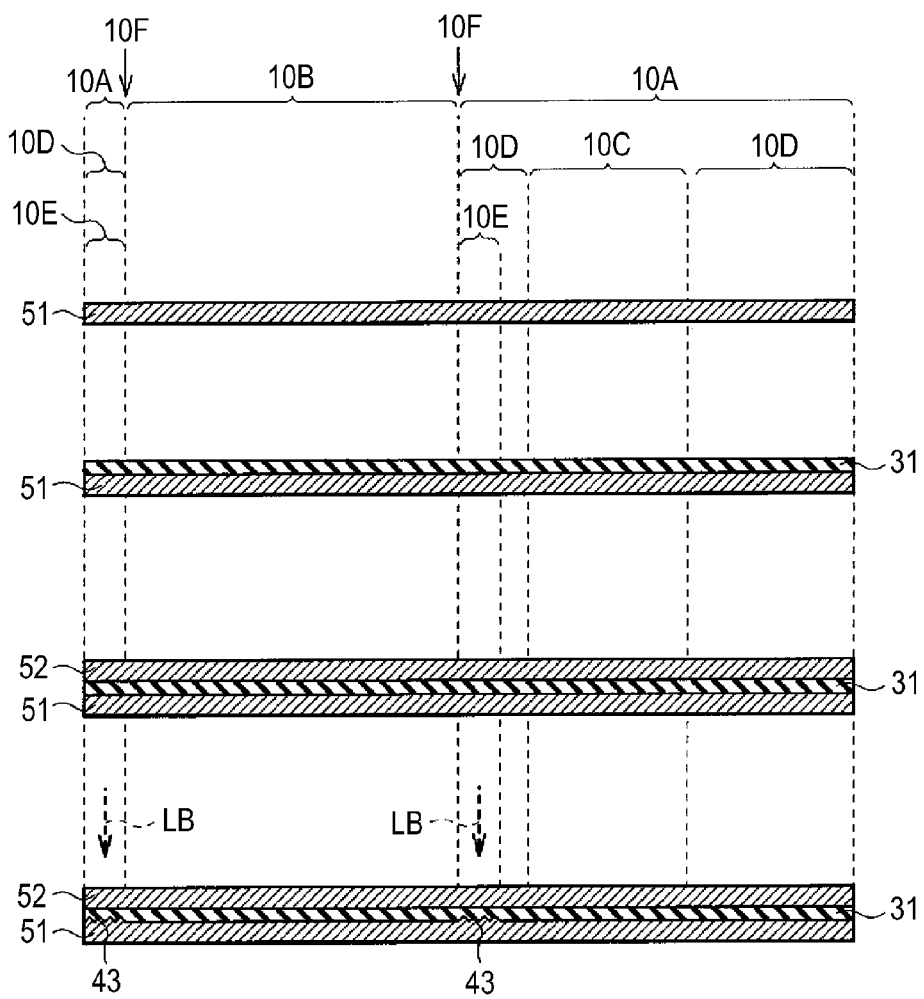
FIGS. 14A to 14D are cross-sectional views illustrating the manufacturing method shown in FIG. 13 in the order of processes.

First, similar to the first embodiment, according to the process shown in FIG. 4A, as shown in FIG. 14A, the metallic foil 51 such as a nickel foil is prepared as the constituent material of the lower electrode 22 and the lower conductive layer 42 (step S101).

Subsequently, similar to the first embodiment, according to the process shown in FIG. 4A, as shown in FIG. 14A, a planarization processing is performed with respect to the surface of the metallic foil 51 by lapping and polishing or the like, and the surface roughness is improved (step S102).

Subsequently, as shown in FIG. 14B, the dielectric layer 31 is provided on the entire surface of the metallic foil 51 (step S203).

Thereafter, as shown in FIG. 14C, the conductive material layer 52 is provided so as to form the upper electrode 21 and the upper conductive layer 41 on the dielectric layer 31 (step S204).

After the conductive material layer 52 is provided on the dielectric layer 31, as shown in FIG. 14D, the roughness of a portion of the surface of the metallic foil 51 which contacts the dielectric layer 31, specifically, the roughness of a portion of the peripheral area 10D which does not contribute to the thin film capacitor Cs is degraded by laser processing (step S205). Specifically, for example, in order to degrade the roughness of the surface of the metallic foil 51 which contacts the dielectric layer 31, a laser beam LB radiates while focusing on the interface between the metallic foil 51 and the dielectric layer 31. Thereby, the roughness of the area which becomes the lower conductive layer 42 of the mooring portion 10E is greater (rougher) than the roughness of the area which becomes the lower electrode 22 of the functional area 10C, and the coarse surface portion 43 is formed.

After the laser processing is performed, similar to the first embodiment, according to the process shown in FIG. 5A, for example, the metallic foil 51 is molded in a predetermined shape by etching, and therefore, the metallic foil 51 of the machining area 10B is selectively removed and the metallic foil 51 remains only on the substrate area 10A. Thereby, the lower electrode 22 of the thin film capacitor Cs is formed on the functional area 10C, and the mooring portion 10E in which the dielectric layer 31 and the lower conductive layer 42 are laminated is formed in the area in which the roughness is degraded (step S206).

After the lower electrode 22 and the mooring portion 10E are formed, similar to the first embodiment, according to the process shown in FIGS. 5B to 5E, a metallic foil 53 is bonded onto the rear surface of the lower electrode 22 and the lower conductive layer 42 while interposing the resin layer 12 in order to form the third wiring layer L3.

After the metallic foil 53 is bonded, similar to the first embodiment, according to the process shown in FIG. 6A, for example, the conductive material layer 52 is molded in a predetermined shape by etching, and therefore, the upper electrode 21 of the thin film capacitor Cs is formed on the functional area 10C and the upper conductive layer 41 is formed on the mooring portion 10E (step S207). Thereby, the thin film capacitor Cs including the dielectric layer 31 between the upper electrode 21 and the lower electrode 22 is formed in the functional area 10C, and the mooring portion 10E including the dielectric layer 31 between the upper conductive layer 41 and the lower conductive layer 42 is formed in a portion of the peripheral area 10D.

At the same time, similar to the first embodiment, according to the process shown in FIG. 6A, the metallic foil 53 is molded in a predetermined shape, and therefore, the third wiring layer L3 is formed (step S108).

After the metallic foils 51 and 53 are molded, similar to the first embodiment, according to the processes shown in FIG. 6B to FIG. 7B, the bonding of the metallic foils 54 and 55 is performed, the metallic foils 54 and 55 are formed in a predetermined shape, and the first wiring layer L1 and the fourth wiring layer L4 are formed (step S109).

Finally, similar to the first embodiment, according to the process shown in FIG. 7B, for example, each of the through-vias 21A and 22A is connected to the upper electrode 21 and the lower electrode 22 of the thin film capacitor Cs by laser processing. From the above, the multilayer wiring board shown in FIG. 1 is completed.

The operation and effect of the multilayer wiring board of the present embodiment are similar to those of the first embodiment.

(First Modification)

Figure 15:
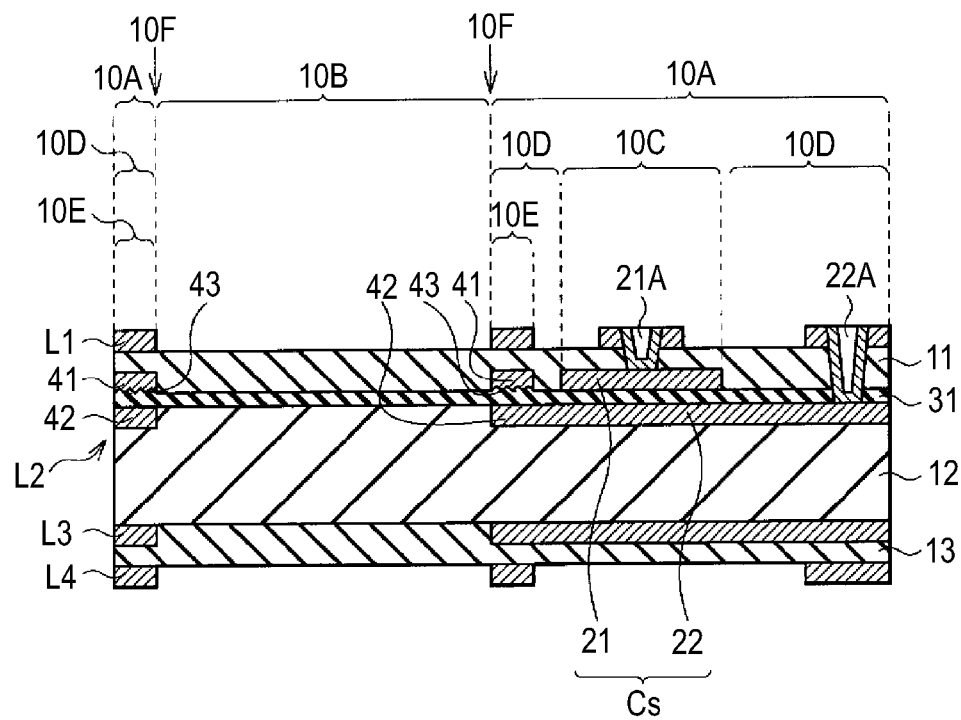
FIG. 15 is a cross-sectional view showing a configuration of a multilayer wiring board according to a first modification.

In addition, in the embodiment, the case where the roughness of the surface of the lower conductive layer 42 which contacts the dielectric layer 31 in the mooring portion 10E is greater than the roughness of the surface of the upper electrode 21 or the lower electrode 22 which contacts the dielectric layer 31 is described. However, as shown in FIG. 15, the roughness of the surface of the upper conductive layer 41 which contacts the dielectric layer 31 in the mooring portion 10E may be greater than the roughness of the surface of the upper electrode 21 or the lower electrode 22 which contacts the dielectric layer 31. In other words, the surface of the upper conductive layer 41 which contacts the dielectric layer 31 may be the coarse surface portion 43. In this case, for example, the laser beam LB radiates while focusing on the interface between the conductive material layer 52 and the dielectric layer 31.

(Second Modification)

Figure 16:
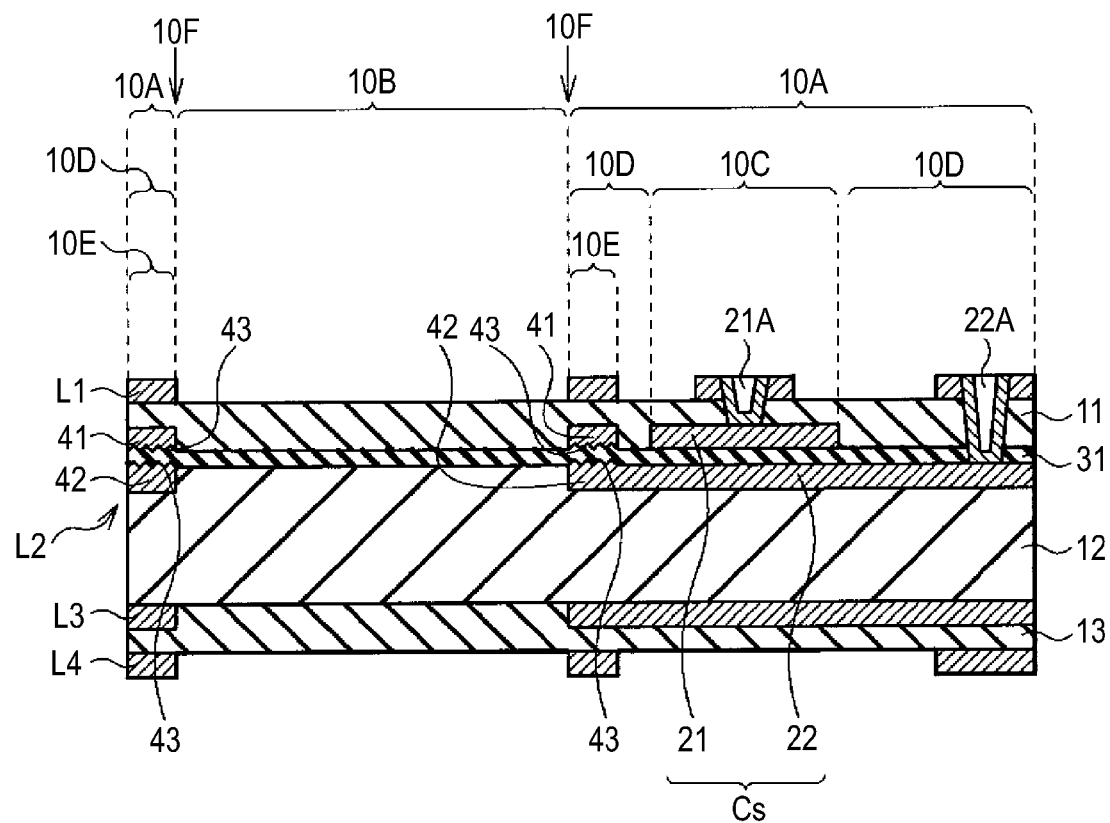
FIG. 16 is a cross-sectional view showing a configuration of a multilayer wiring board according to a second modification.

Alternatively, as shown in FIG. 16, the roughness of the surfaces of both the upper conductive layer 41 and the lower conductive layer 42 which contact the dielectric layer 31 in the mooring portion 10E may be greater than the roughness of the surface of the upper electrode 21 or the lower electrode 22 which contacts the dielectric layer 31. In other words, the surfaces of both the upper conductive layer 41 and the lower conductive layer 42 which contact the dielectric layer 31 may be the coarse surface portion 43. In this way, the anchoring function which improves the adhesiveness between the upper conductive layer 41 and the lower conductive layer 42 and the dielectric layer 31 in the mooring portion 10E is further strengthened, and the peeling at the interface between the upper electrode 21 or the lower electrode 22 of the thin film capacitor Cs and the dielectric layer 31 can be suppressed more reliably in the functional area 10C.

(Fourth Embodiment)

Figure 17:
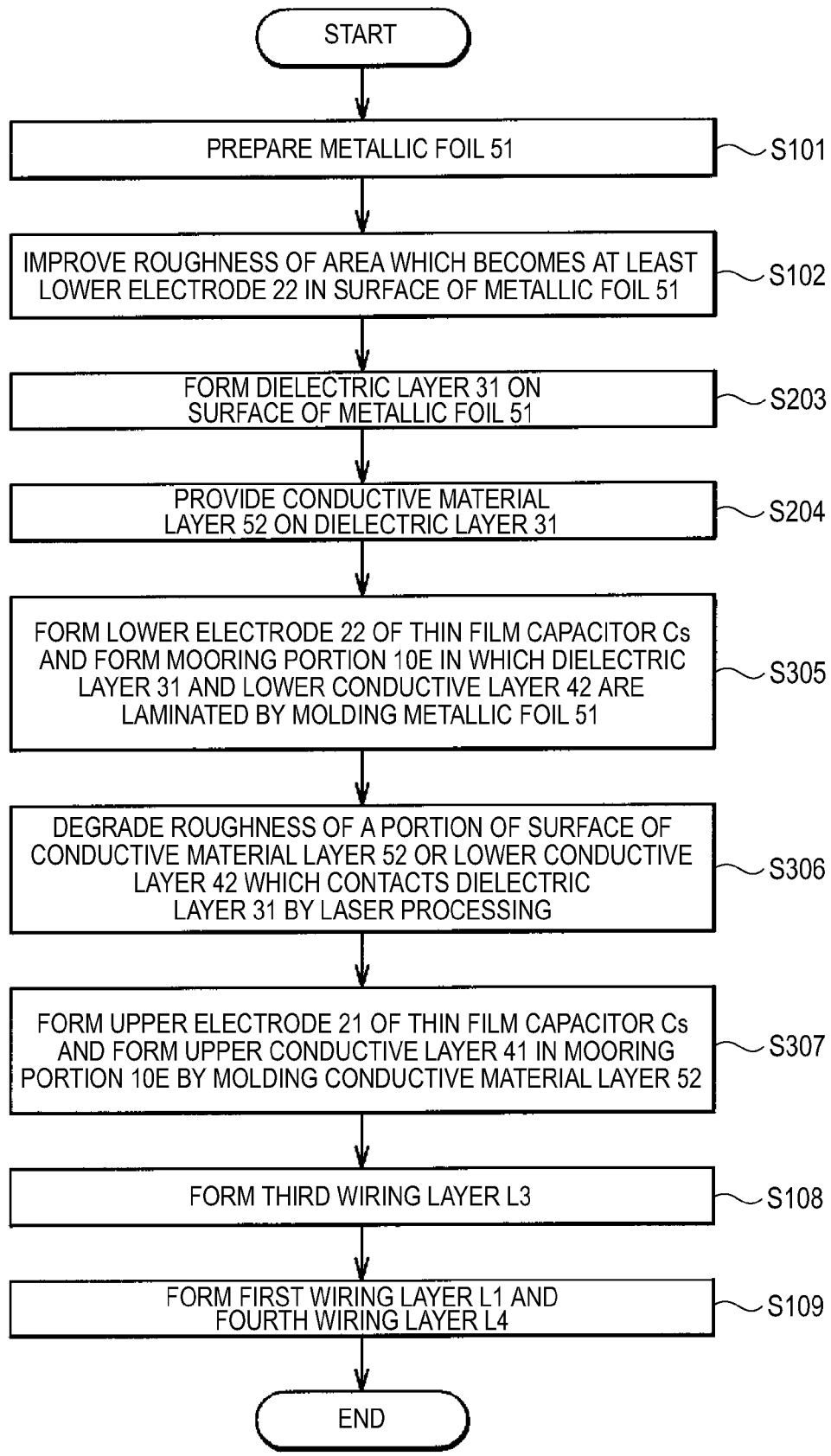
FIG. 17 is a flow diagram showing a method of manufacturing a multilayer wiring board according to a fourth embodiment of the present disclosure.

FIG. 17 is a flow diagram showing the method of manufacturing the multilayer wiring board according to a fourth embodiment of the present disclosure, and FIGS. 18A to 18C illustrates the manufacturing method shown in FIG. 17 in the order of processes. This manufacturing method is different from that of the third embodiment in that the roughness degradation process is performed by laser processing after the metallic foil 51 is molded and the lower conductive layer 42 is formed. Moreover, the processes overlapping with those of the first embodiment will be described with reference to FIGS. 4A to 7B and the processes overlapping with those of the third embodiment will be described with reference to FIGS. 14A to 14D. In addition, this manufacturing method is not limited to the case where the multilayer wiring board of the first embodiment is manufactured. However, in the present embodiment, for example, the case where the mooring portion 10E is provided along the outline 10F like the first embodiment will be described as the example.

First, similar to the first embodiment, according to the process shown in FIG. 4A, the metallic foil 51 such as a nickel foil is prepared as the constituent material of the lower electrode 22 and the lower conductive layer 42 (step S101).

Subsequently, similar to the first embodiment, according to the process shown in FIG. 4A, a planarization processing is performed with respect to the surface of the metallic foil 51 by lapping and polishing or the like, and the surface roughness is improved (step S102).

Subsequently, similar to the third embodiment, according to the process shown in FIG. 14B, the dielectric layer 31 is provided on the entire surface of the metallic foil 51 (step S203).

Thereafter, similar to the third embodiment, according to the process shown in FIG. 14C, as shown in FIG. 18A, the conductive material layer 52 is provided so as to form the upper electrode 21 and the upper conductive layer 41 on the dielectric layer 31 (step S204).

After the conductive material layer 52 is provided on the dielectric layer 31, similar to the first embodiment, according to the process shown in FIG. 5A, as shown in FIG. 18B, for example, the metallic foil 51 is molded in a predetermined shape by etching, and therefore, the metallic foil 51 of the machining area 10B is selectively removed and the metallic foil 51 remains only on the substrate area 10A. Thereby, the lower electrode 22 of the thin film capacitor Cs is formed in the functional area 10C, and the mooring portion 10E in which the dielectric layer 31 and the lower conductive layer 42 are laminated is formed in a portion of the peripheral area 10D (step S305).

After the lower electrode 22 and the mooring portion 10E are formed, as shown in FIG. 18C, the roughness of a portion of the surface of the lower conductive layer 42 which contacts the dielectric layer 31, specifically, the roughness of a portion of the peripheral area 10D which does not contribute to the thin film capacitor Cs is degraded by laser processing (step S306). Specifically, for example, in order to degrade the roughness of the surface of the lower conductive layer 42 which contacts the dielectric layer 31, a laser beam LB radiates while focusing on the interface between the lower conductive layer 42 and the dielectric layer 31. Thereby, the roughness of the surface of the lower conductive layer 42 which contacts the dielectric layer 31 in the mooring portion 10E is greater (rougher) than the roughness of the surface of the upper electrode 21 or the lower electrode 22 which contacts the dielectric layer 31 in the functional area 10C, and the coarse surface portion 43 is formed.

After the laser processing is performed, similar to the first embodiment, according to the processes shown in FIGS. 5B to 5E, the metallic foil 53 is bonded onto the rear surface of the lower electrode 22 and the lower conductive layer 42 while interposing the resin layer 12 in order to form the third wiring layer L3.

After the metallic foil 53 is bonded, similar to the first embodiment, according to the process shown in FIG. 6A, for example, the conductive material layer 52 is molded in a predetermined shape by etching, and therefore, the upper electrode 21 of the thin film capacitor Cs is formed on the functional area 10C and the upper conductive layer 41 is formed on the mooring portion 10E (step S307). Thereby, the thin film capacitor Cs including the dielectric layer 31 between the upper electrode 21 and the lower electrode 22 is formed in the functional area 10C, and the mooring portion 10E including the dielectric layer 31 between the upper conductive layer 41 and the lower conductive layer 42 is formed in a portion of the peripheral area 10D.

At the same time, similar to the first embodiment, according to the process shown in FIG. 6A, the metallic foil 53 is molded in a predetermined shape, and therefore, the third wiring layer L3 is formed (step S108).

After the metallic foils 51 and 53 are molded, similar to the first embodiment, according to the processes shown in FIG. 6B to FIG. 7B, the metallic foils 54 and 55 are bonded, the metallic foils 54 and 54 are formed in a predetermined shape, and the first wiring layer L1 and the fourth wiring layer L4 are formed (step S109).

Finally, similar to the first embodiment, according to the process shown in FIG. 7B, for example, each of the through-vias 21A and 22A is connected to the upper electrode 21 and the lower electrode 22 of the thin film capacitor Cs by laser processing. From the above, the multilayer wiring board shown in FIG. 1 is completed.

The operation and effect of the multilayer wiring board are similar to those of the first embodiment.

Moreover, the first modification (FIG. 15) and the second modification (FIG. 16) of the third embodiment may be applied to the present embodiment.

(Fifth Embodiment)

FIG. 19 is a flow diagram showing the method of manufacturing the multilayer wiring board according to a fourth embodiment of the present disclosure, and FIGS. 20A to 21B illustrate the manufacturing method shown in FIG. 19 in the order of processes. The manufacturing method is different from the third embodiment in that the roughness degradation process is performed by laser processing after the thin film capacitor Cs is formed. Moreover, the processes overlapping with those of the first embodiment will be described with reference to FIGS. 4A to 7B and the processes overlapping with those of the third embodiment will be described with reference to FIGS. 14A to 14D. In addition, this manufacturing method is not limited to the case where the multilayer wiring board of the first embodiment is manufactured. However, in the present embodiment, for example, the case where the mooring portion 10E is provided along the outline 10F like the first embodiment will be described as the example.

First, similar to the first embodiment, according to the process shown in FIG. 4A, the metallic foil 51 such as a nickel foil is prepared as the constituent material of the lower electrode 22 and the lower conductive layer 42 (step S101).

Subsequently, similar to the first embodiment, according to the process shown in FIG. 4A, a planarization processing is performed with respect to the surface of the metallic foil 51 by lapping and polishing or the like, and the surface roughness is improved (step S102).

Subsequently, similar to the third embodiment, according to the process shown in FIG. 14B, the dielectric layer 31 is provided on the entire surface of the metallic foil 51 (step S203).

Thereafter, similar to the third embodiment, according to the process shown in FIG. 14C, as shown in FIG. 20A, the conductive material layer 52 is provided so as to form the upper electrode 21 and the upper conductive layer 41 on the dielectric layer 31 (step S204).

After the conductive material layer 52 is provided on the dielectric layer 31, similar to the first embodiment, according to the process shown in FIG. 5A, as shown in FIG. 20B, for example, the metallic foil 51 is molded in a predetermined shape by etching, and therefore, the metallic foil 51 of the machining area 10B is selectively removed and the metallic foil 51 remains only on the substrate area 10A. Thereby, the lower electrode 22 of the thin film capacitor Cs is formed in the functional area 10C, and the mooring portion 10E in which the dielectric layer 31 and the lower conductive layer 42 are laminated is formed in a portion of the peripheral area 10D (step S405).

After the lower electrode 22 and the mooring portion 10E are formed, similar to the first embodiment, according to the processes shown in FIG. 5B to 5E, as shown in FIGS. 20C to 20F, the metallic foil 53 is bonded onto the rear surface of the lower electrode 22 and the lower conductive layer 42 while interposing the resin layer 12 in order to form the third wiring layer L3.

Figures 21A, 21B:
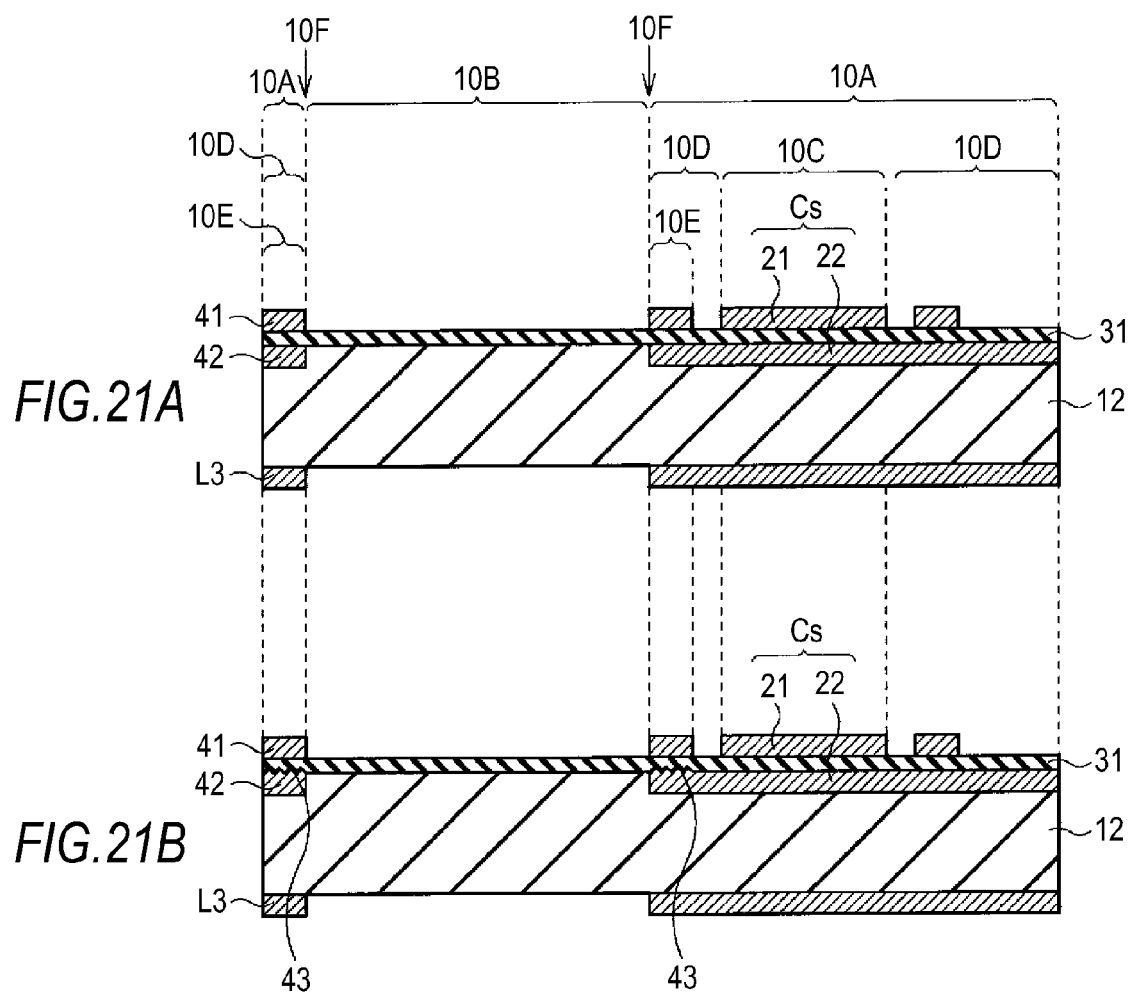
FIGS. 21A and 21B are cross-sectional views showing processes continuing to FIGS. 20A to 20F.

After the metallic foil 53 is bonded, similar to the first embodiment, according to the process shown in FIG. 6B, as shown in FIG. 21A, for example, the conductive material layer 52 is molded in a predetermined shape by etching, and therefore, the upper electrode 21 of the thin film capacitor Cs is formed on the functional area 10C and the upper conductive layer 41 is formed on the mooring portion 10E (step S406). Thereby, the thin film capacitor Cs including the dielectric layer 31 between the upper electrode 21 and the lower electrode 22 is formed in the functional area 10C, and the mooring portion 10E including the dielectric layer 31 between the upper conductive layer 41 and the lower conductive layer 42 is formed in a portion of the peripheral area 10D.

At the same time, similar to the first embodiment, according to the process shown in FIG. 6A, as shown in FIG. 21A, the metallic foil 53 is molded in a predetermined shape, and therefore, the third wiring layer L3 is formed (step S407).

After the upper electrode 21 and the upper conductive layer 41 is formed, as shown in FIG. 21B, the roughness of a portion of the surface of the lower conductive layer 42 which contacts the dielectric layer 31, specifically, the roughness of a portion of the peripheral area 10D which does not contribute to the thin film capacitor Cs is degraded by laser processing (step S408). Specifically, for example, in order to degrade the roughness of the surface of the lower conductive layer 42 which contacts the dielectric layer 31, a laser beam LB radiates while focusing on the interface between the lower conductive layer 42 and the dielectric layer 31. Thereby, the roughness of the surface of the lower conductive layer 42 which contacts the dielectric layer 31 in the mooring portion 10E is greater (rougher) than the roughness of the surface of the upper electrode 21 or the lower electrode 22 which contacts the dielectric layer 31 in the functional area 10C, and the coarse surface portion 43 is formed.

After the metallic foils 51 and 53 are molded, similar to the first embodiment, according to the processes shown in FIG. 6B to FIG. 7B, the bonding of the metallic foils 54 and 55 is performed, the metallic foils 54 and 55 are molded in a predetermined shape, and therefore, the first wiring layer L1 and the fourth wiring layer L4 are formed (step S109).

Finally, similar to the first embodiment, according to the process shown in FIG. 7B, for example, the through-vias 21A and 22A are connected to the upper electrode 21 and the lower electrode 22 respectively of the thin film capacitor Cs by laser processing. From the above, the multilayer wiring board shown in FIG. 1 is completed.

The operation and effect of the multilayer wiring board of the present embodiment are similar to those of the first embodiment.

(Third Modification)

Figure 22:
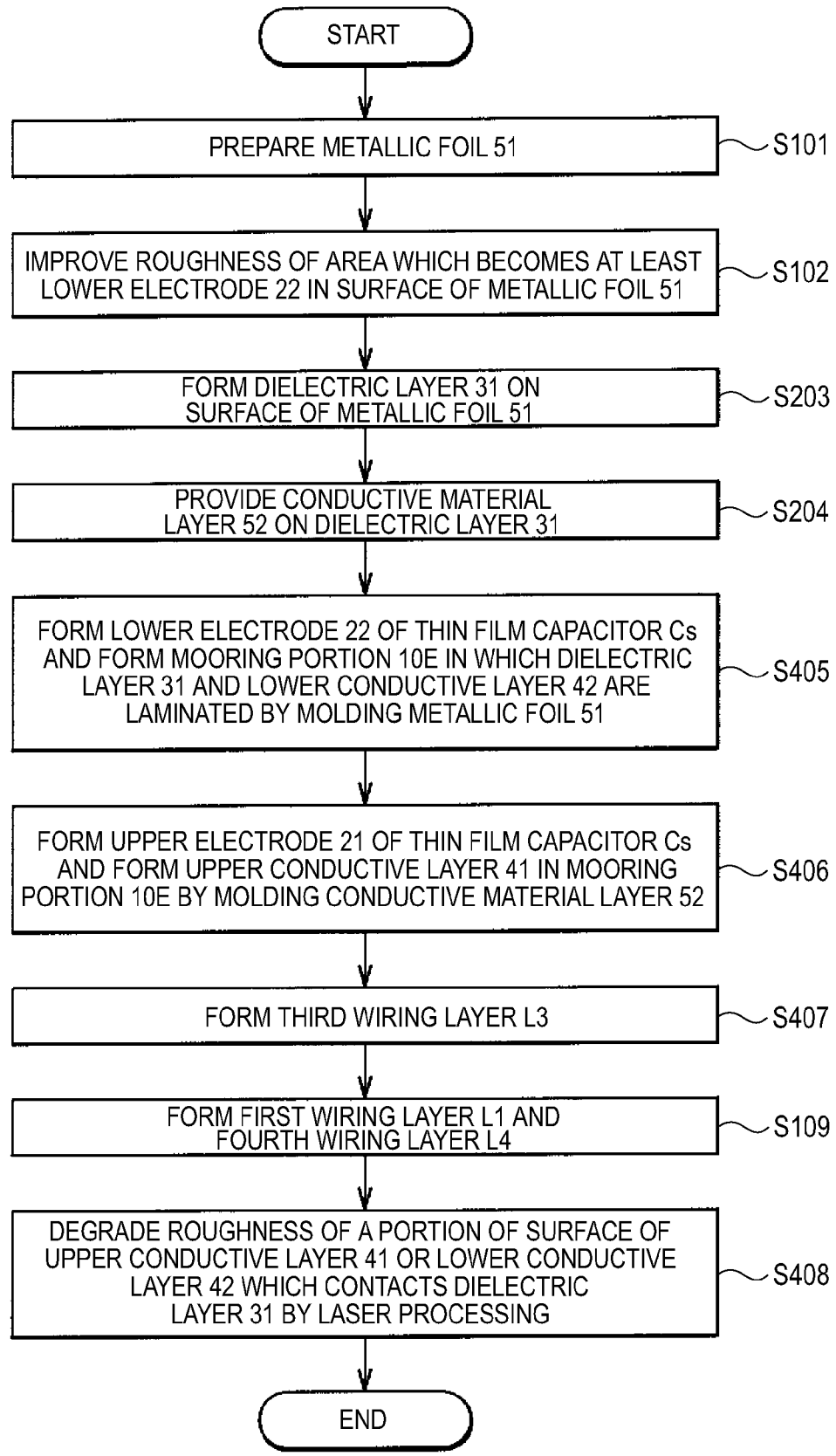
FIG. 22 is a flow diagram showing a method of manufacturing a multilayer wiring board according to a third modification.

In addition, in the embodiment, the case where the laser processing is performed after the metallic foil 51 and the conductive material layer 52 are molded and the thin film capacitor Cs and the mooring portion 10E are formed is described. However, for example, as shown in FIG. 22, the laser processing may be performed (step S408) after the first wiring layer L1 and the fourth wiring layer L4 are formed (step S109) and the thin film capacitor Cs is embedded in the multilayer wiring board.

Moreover, the first modification (FIG. 15) and the second modification (FIG. 16) of the third embodiment may be applied to the fifth embodiment or the third modification.

(Sixth Embodiment)

Figure 23:
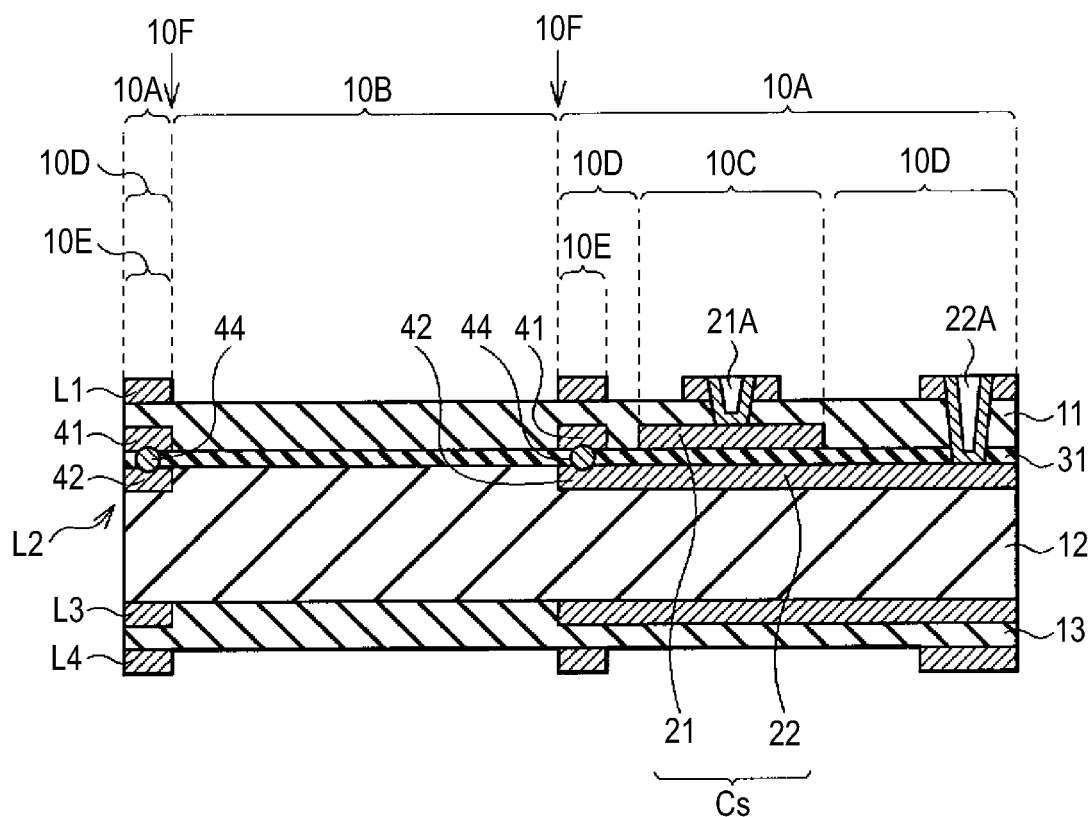
FIG. 23 is a cross-sectional view showing a configuration of a multilayer wiring board according to a sixth embodiment of the present disclosure.

FIG. 23 shows a cross-sectional configuration of a multilayer wiring board according to a sixth embodiment of the present disclosure. In the multilayer wiring board, in the mooring portion 10E, the upper conductive layer 41 and the lower conductive layer 42 penetrate the dielectric layer 31 via a connecting portion 44, are physically connected to each other, and are electrically shorted. Thereby, in the multilayer wiring board, similar to the first embodiment, the peeling at the interface between the upper electrode 21 or the lower electrode 22 of the thin film capacitor Cs and the dielectric layer 31 can be suppressed. Except for this, the multilayer wiring board of the sixth embodiment includes the same configuration, operation and effects as those of the first embodiment.

For example, the multilayer wiring board may be manufactured as follows.

Figure 24:
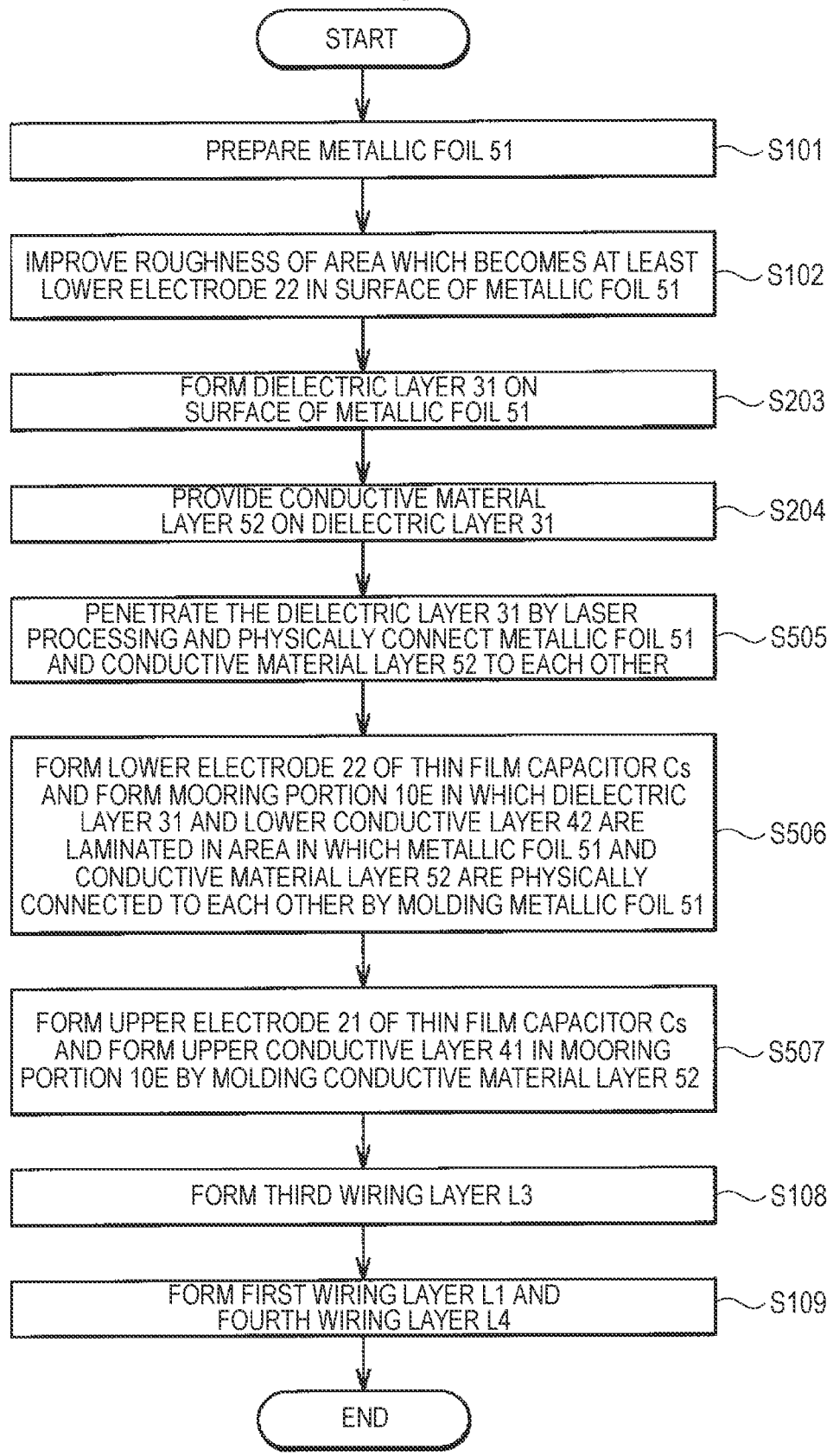
FIG. 24 is a flow diagram illustrating the manufacturing method of the multilayer wiring board shown in FIG. 23.

FIG. 24 is a flow diagram illustrating the manufacturing method of the multilayer wiring board. Moreover, the processes overlapping with those of the first embodiment will be described with reference to FIGS. 4A to 7B and the processes overlapping with those of the third embodiment will be described with reference to FIGS. 14A to 14D. In addition, this manufacturing method is not limited to the case where the multilayer wiring board of the first embodiment is manufactured. However, in the description below, for example, the case where the mooring portion 10E is provided along the outline 10F like the first embodiment will be described as the example.

First, similar to the first embodiment, according to the process shown in FIG. 4A, the metallic foil 51 such as a nickel foil is prepared as the constituent material of the lower electrode 22 and the lower conductive layer 42 (step S101).

Subsequently, similar to the first embodiment, according to the process shown in FIG. 4A, a planarization processing is performed with respect to the surface of the metallic foil 51 by lapping and polishing or the like, and the surface roughness is improved (step S102).

Subsequently, similar to the third embodiment, according to the process shown in FIG. 14B, the dielectric layer 31 is provided on the entire surface of the metallic foil 51 (step S203).

Thereafter, similar to the third embodiment, according to the process shown in FIG. 14C, the conductive material layer 52 is provided so as to form the upper electrode 21 and the upper conductive layer 41 on the dielectric layer 31 (step S204).

After the conductive material layer 52 is formed on the dielectric layer 31, the metallic foil 51 and the conductive material layer 52 penetrate the dielectric layer 31 through the connecting portion 44 by laser processing and are physically connected to each (step S505).

After the laser processing is performed, similar to the first embodiment, according to the process shown in FIG. 5A, for example, the metallic foil 51 is molded in a predetermined shape by etching, and therefore, the metallic foil 51 of the machining area 10B is selectively removed and the metallic foil 51 remains only on the substrate area 10A. Thereby, the lower electrode 22 of the thin film capacitor Cs is formed on the functional area 10C, and the mooring portion 10E in which the dielectric layer 31 and the lower conductive layer 42 are laminated is formed in the area in which the metallic foil 51 and the conductive material layer 52 are physically connected to each other (step S506). At this time, since the mooring portion 10E is a portion of the peripheral area 10D which does not contribute to the thin film capacitor Cs, even though the dielectric layer 31 is subjected to damage such as burning due to the laser processing and the lower conductive layer 42 (metallic foil 51) and the conductive material layer 52 are electrically shorted via the connecting portion 44, problems do not occur.

After the lower electrode 22 and the mooring portion 10E are formed, similar to the first embodiment, according to the process shown in FIGS. 5B to 5E, the metallic foil 53 is bonded onto the rear surface of the lower electrode 22 and the lower conductive layer 42 while interposing the resin layer 12 in order to form the third wiring layer L3.

After the metallic foil 53 is bonded, similar to the first embodiment, according to the process shown in FIG. 6A, for example, the conductive material layer 52 is molded in a predetermined shape by etching, and therefore, the upper electrode 21 of the thin film capacitor Cs is formed on the functional area 10C and the upper conductive layer 41 is formed on the mooring portion 10E (step S507). Thereby, the thin film capacitor Cs including the dielectric layer 31 between the upper electrode 21 and the lower electrode 22 is formed in the functional area 10C, and the mooring portion 10E including the dielectric layer 31 between the upper conductive layer 41 and the lower conductive layer 42 is formed in a portion of the peripheral area 10D.

At the same time, similar to the first embodiment, according to the process shown in FIG. 6A, the metallic foil 53 is molded in a predetermined shape, and therefore, the third wiring layer L3 is formed (step S108).

After the metallic foils 51 and 53 are molded, similar to the first embodiment, according to the processes shown in FIG. 6B to FIG. 7B, the bonding of the metallic foils 54 and 55 are performed, the metallic foils 54 and 55 are molded in a predetermined shape, and therefore, the first wiring layer L1 and the fourth wiring layer L4 are formed (step S109).

Finally, similar to the first embodiment, according to the process shown in FIG. 7B, for example, the through-vias 21A and 22A are connected to the upper electrode 21 and the lower electrode 22 respectively of the thin film capacitor Cs by laser processing. From the above, the multilayer wiring board shown in FIG. 23 is completed.

Moreover, for example, the multilayer wiring board may be manufactured as follows.

Figure 25:
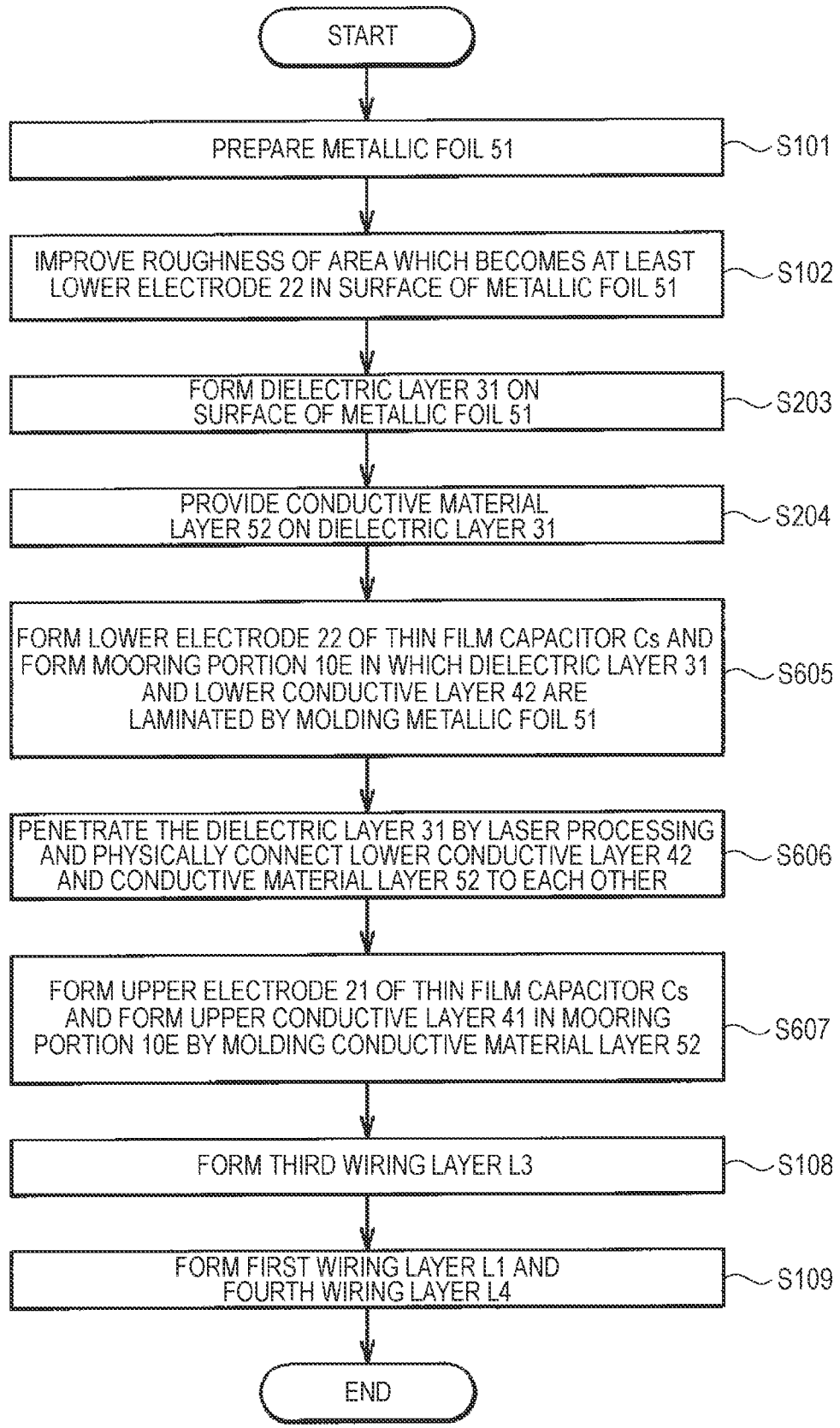
FIG. 25 is a flow diagram illustrating another method of manufacturing the multilayer wiring board shown in FIG. 23.

FIG. 25 is a flow diagram illustrating another method of manufacturing the multilayer wiring board. Moreover, the processes overlapping with those of the first embodiment will be described with reference to FIGS. 4A to 7B and the processes overlapping with those of the third embodiment will be described with reference to FIGS. 14A to 14D. In addition, this manufacturing method is not limited to the case where the multilayer wiring board of the first embodiment is manufactured. However, in the present embodiment, for example, the case where the mooring portion 10E is provided along the outline 10F like the first embodiment will be described as the example.

First, similar to the first embodiment, according to the process shown in FIG. 4A, the metallic foil 51 such as a nickel foil is prepared as the constituent material of the lower electrode 22 and the lower conductive layer 42 (step S101).

Subsequently, similar to the first embodiment, according to the process shown in FIG. 4A, a planarization processing is performed with respect to the surface of the metallic foil 51 by lapping and polishing or the like, and the surface roughness is improved (step S102).

Subsequently, similar to the third embodiment, according to the process shown in FIG. 14B, the dielectric layer 31 is provided on the entire surface of the metallic foil 51 (step S203).

Thereafter, similar to the third embodiment, according to the process shown in FIG. 14C, the conductive material layer 52 is provided so as to form the upper electrode 21 and the upper conductive layer 41 on the dielectric layer 31 (step S204).

After the conductive material layer 52 is provided on the dielectric layer 31, similar to the first embodiment, according to the process shown in FIG. 5A, for example, the metallic foil 51 is molded in a predetermined shape by etching, and therefore, the metallic foil 51 of the machining area 10B is selectively removed and the metallic foil 51 remains only on the substrate area 10A. Thereby, the lower electrode 22 of the thin film capacitor Cs is formed in the functional area 10C, and the mooring portion 10E in which the dielectric layer 31 and the lower conductive layer 42 are laminated is formed in a portion of the peripheral area 10D (step S605).

After the lower electrode 22 and the mooring portion 10E are formed, the lower conductive layer 42 and the conductive material layer 52 in the mooring portion 10E penetrate the dielectric layer 31 through the connecting portion 44 by laser processing and are physically connected to each other (step S606).

After the laser processing is performed, similar to the first embodiment, according to the processes shown in FIGS. 5B to 5E, the metallic foil 53 is bonded onto the rear surface of the lower electrode 22 and the lower conductive layer 42 while interposing the resin layer 12 in order to form the third wiring layer L3. Moreover, the bonding of the metallic foil 53 may be performed before the laser processing.

After the metallic foil 53 is bonded, similar to the first embodiment, according to the process shown in FIG. 6A, for example, the conductive material layer 52 is molded in a predetermined shape by etching, and therefore, the upper electrode 21 of the thin film capacitor Cs is formed on the functional area 10C and the upper conductive layer 41 is formed on the mooring portion 10E (step S607). Thereby, the thin film capacitor Cs including the dielectric layer 31 between the upper electrode 21 and the lower electrode 22 is formed in the functional area 10C, and the mooring portion 10E including the dielectric layer 31 between the upper conductive layer 41 and the lower conductive layer 42 is formed in a portion of the peripheral area 10D.

Moreover, similar to the first embodiment, according to the process shown in FIG. 6A, the metallic foil 53 is molded in a predetermined shape, and therefore, the third wiring layer L3 is formed (step S108).

After the metallic foils 51 and 53 are molded, similar to the first embodiment, according to the processes shown in FIG. 6B to FIG. 7B, the bonding of the metallic foils 54 and 55 is performed, the metallic foils 54 and 55 are molded in a predetermined shape, and therefore, the first wiring layer L1 and the fourth wiring layer L4 are formed (step S109).

Finally, similar to the first embodiment, according to the process shown in FIG. 7B, for example, the through-vias 21A and 22A are connected to the upper electrode 21 and the lower electrode 22 respectively of the thin film capacitor Cs by laser processing. From the above, the multilayer wiring board shown in FIG. 23 is completed.

Alternatively, for example, the multilayer wiring board may be manufactured as follows.

Figure 26:
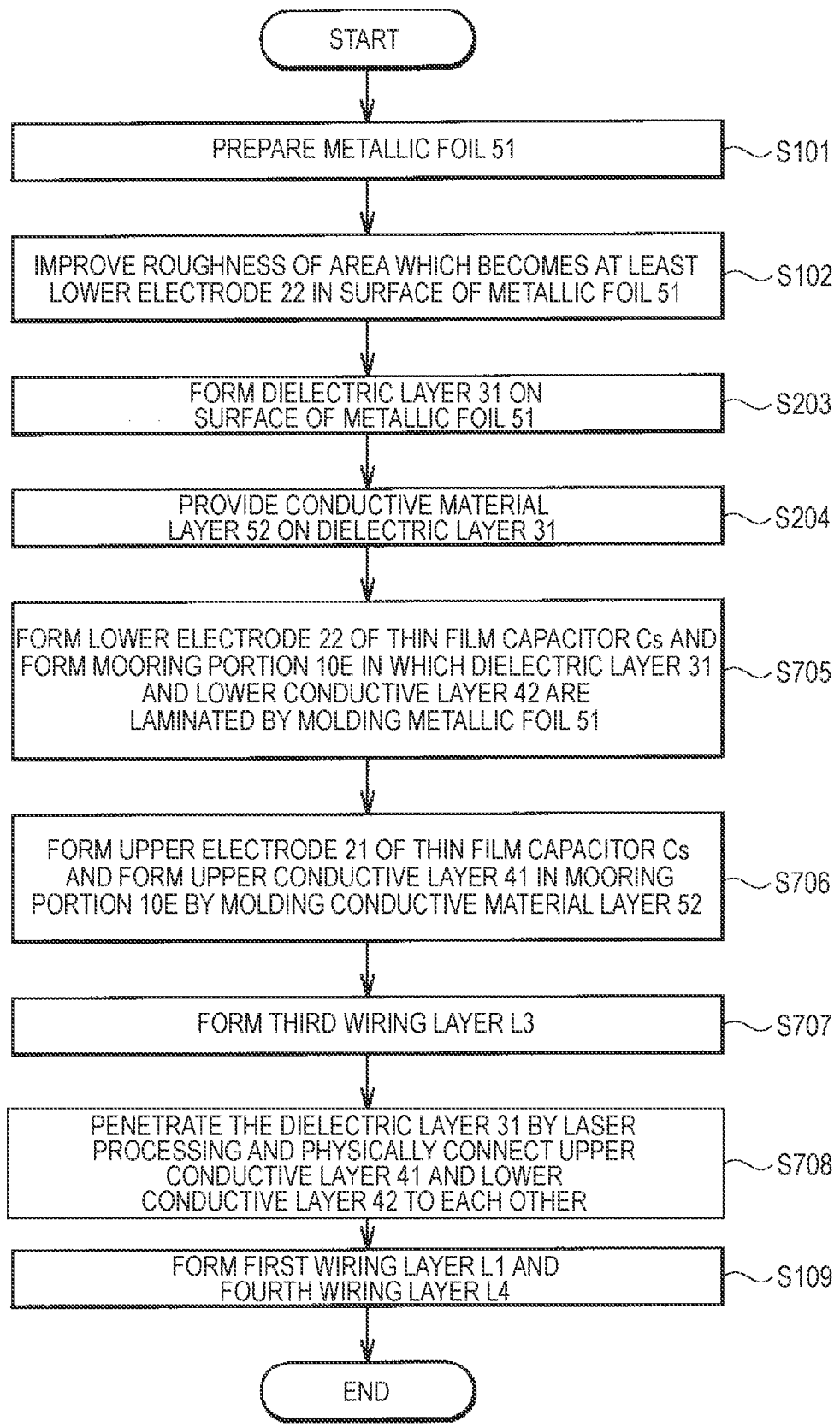
FIG. 26 is a flow diagram illustrating still another method of manufacturing the multilayer wiring board shown in FIG. 23.

FIG. 26 is a flow diagram illustrating still another method of manufacturing the multilayer wiring board. Moreover, the processes overlapping with those of the first embodiment will be described with reference to FIGS. 4A to 7B and the processes overlapping with those of the third embodiment will be described with reference to FIGS. 14A to 14D. In addition, this manufacturing method is not limited to the case where the multilayer wiring board of the first embodiment is manufactured. However, in the present embodiment, for example, the case where the mooring portion 10E is provided along the outline 10F like the first embodiment will be described as the example.

First, similar to the first embodiment, according to the process shown in FIG. 4A, the metallic foil 51 such as a nickel foil is prepared as the constituent material of the lower electrode 22 and the lower conductive layer 42 (step S101).

Subsequently, similar to the first embodiment, according to the process shown in FIG. 4A, a planarization processing is performed with respect to the surface of the metallic foil 51 by lapping and polishing or the like, and the surface roughness is improved (step S102).

Subsequently, similar to the third embodiment, according to the process shown in FIG. 14B, the dielectric layer 31 is provided on the entire surface of the metallic foil 51 (step S203).

Thereafter, similar to the third embodiment, according to the process shown in FIG. 14C, the conductive material layer 52 is provided so as to form the upper electrode 21 and the upper conductive layer 41 on the dielectric layer 31 (step S204).

After the conductive material layer 52 is provided on the dielectric layer 31, similar to the first embodiment, according to the process shown in FIG. 5A, for example, the metallic foil 51 is molded in a predetermined shape by etching, and therefore, the metallic foil 51 of the machining area 10B is selectively removed and the metallic foil 51 remains only on the substrate area 10A. Thereby, the lower electrode 22 of the thin film capacitor Cs is formed in the functional area 10C, and the mooring portion 10E in which the dielectric layer 31 and the lower conductive layer 42 are laminated is formed in a portion of the peripheral area 10D (step S705).

After the lower electrode 22 and the mooring portion 10E are formed, similar to the first embodiment, according to the processes shown in FIGS. 5B to 5E, the metallic foil 53 is bonded onto the rear surface of the lower electrode 22 and the lower conductive layer 42 while interposing the resin layer 12 in order to form the third wiring layer L3.

After the metallic foil 53 is bonded, similar to the first embodiment, according to the process shown in FIG. 6A, for example, the conductive material layer 52 is molded in a predetermined shape by etching, and therefore, the upper electrode 21 of the thin film capacitor Cs is formed on the functional area 10C and the upper conductive layer 41 is formed on the mooring portion 10E (step S706). Thereby, the thin film capacitor Cs including the dielectric layer 31 between the upper electrode 21 and the lower electrode 22 is formed in the functional area 10C, and the mooring portion 10E including the dielectric layer 31 between the upper conductive layer 41 and the lower conductive layer 42 is formed in a portion of the peripheral area 10D.

At the same time, similar to the first embodiment, according to the process shown in FIG. 6A, the metallic foil 53 is molded in a predetermined shape, and therefore, the third wiring layer L3 is formed (step S707).

After the upper electrode 21, the upper conductive layer 41, and the third wiring layer L3 are formed, the upper conductive layer 41 and the lower conductive layer 42 penetrate the dielectric layer 31 through the connecting portion 44 by laser processing and are physically connected to each other (step S708).

After the metallic foils 51 and 53 are molded, similar to the first embodiment, according to the processes shown in FIG. 6B to FIG. 7B, the metallic foils 54 and 55 are bonded, the metallic foils 54 and 55 are molded in a predetermined shape, and therefore, the first wiring layer L1 and the fourth wiring layer L4 are formed (step S109).

Finally, similar to the first embodiment, according to the process shown in FIG. 7B, for example, the through-vias 21A and 22A are connected to the upper electrode 21 and the lower electrode 22 respectively of the thin film capacitor Cs by laser processing. From the above, the multilayer wiring board shown in FIG. 23 is completed.

Figure 27:
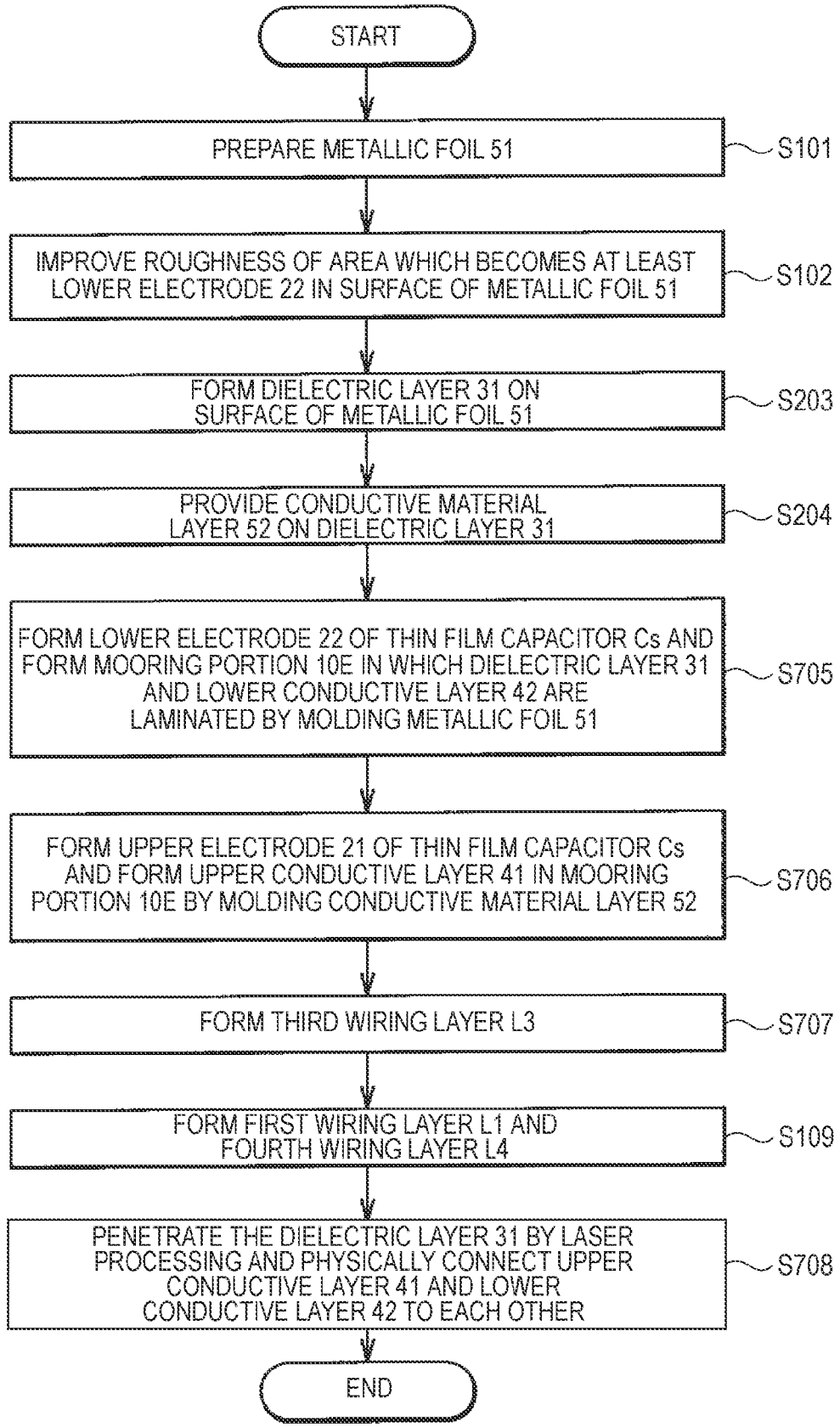
FIG. 27 is a flow diagram illustrating still another method of manufacturing the multilayer wiring board shown in FIG. 23.

Moreover, in the manufacturing method shown in FIG. 26, similar to the third modification, as shown in FIG. 27, the laser processing may be performed (step S708) after the first wiring layer L1 and the fourth wiring layer L4 are formed (step S109) and the thin film capacitor Cs is embedded in the multilayer wiring board.

In the multilayer wiring board, since the upper conductive layer 41 and the lower conductive layer 42 in the mooring portion 10E penetrate the dielectric layer 31 through the connecting portion 44 and are physically connected to each other, adhesiveness between the upper conductive layer 41 and the lower conductive layer 42 is improved. Thereby, the peeling at the interface between the upper electrode 21 and the lower electrode 22 of the thin film capacitor Cs and the dielectric layer 31 is suppressed in the functional area 10C.

In this way, in the present embodiment, the upper conductive layer 41 and the lower conductive layer 42 in the mooring portion 10E penetrate the dielectric layer 31 and are physically connected to each other. Thereby, the adhesiveness between the upper conductive layer 41 and the lower conductive layer 42 is improved in the mooring portion 10E, and the peeling at the interface between the upper electrode 21 or the lower electrode 22 of the thin film capacitor Cs and the dielectric layer 31 can be suppressed in the functional area 10C.

(Fourth Modification)

Figure 28:
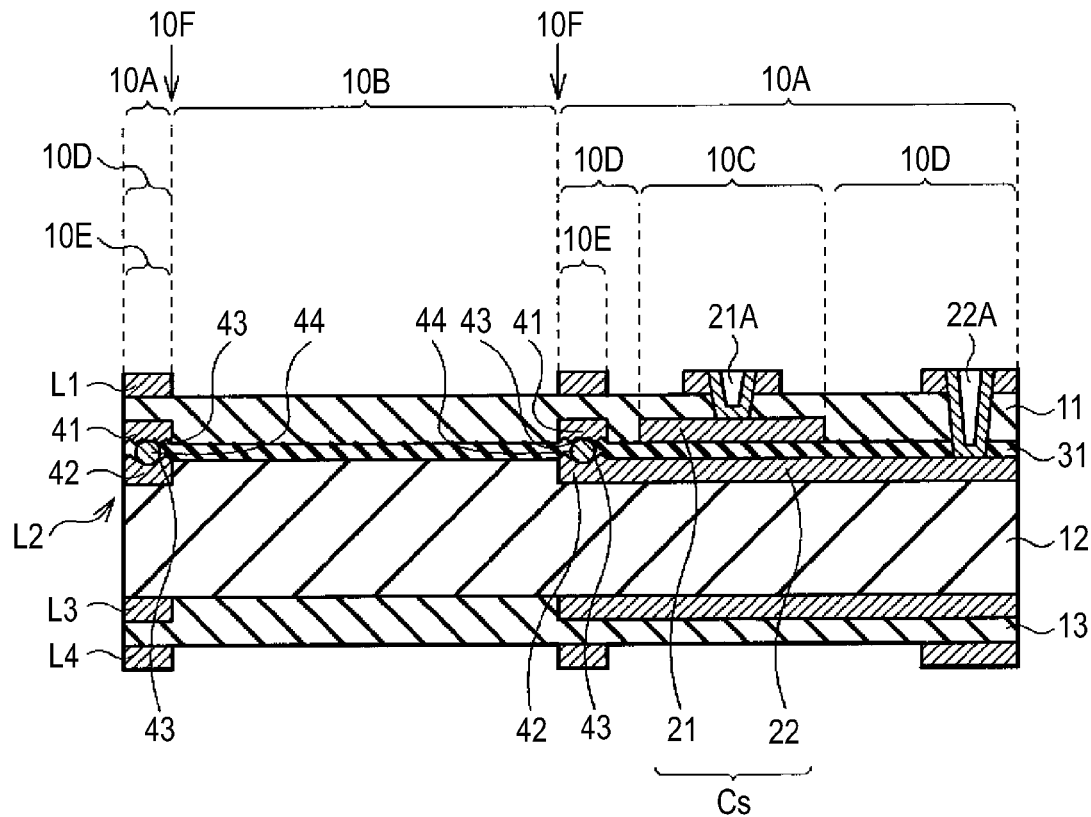
FIG. 28 is a cross-sectional view showing a configuration of a multilayer wiring board according to a fourth modification.

Moreover, in the embodiment, the case where the upper conductive layer 41 and the lower conductive layer 42 in the mooring portion 10E penetrate the dielectric layer 31 and are physically connected to each other is described. However, the present embodiment and the first embodiment may be combined. For example, as shown in FIG. 28, in the mooring portion 10E, the roughness of the surface of the upper conductive layer 41 and the lower conductive layer 42 which contacts the dielectric layer 31 may be greater than the roughness of the surface of the upper electrode 21 or the lower electrode 22 which contacts the dielectric layer 31 (in other words, the surface of the upper conductive layer 41 or the lower conductive layer 42 which contacts the dielectric layer 31 becomes the coarse surface portion 43), and the upper conductive layer 41 and the lower conductive layer 42 penetrate the dielectric layer 31 and are physically connected to each other. Since the mooring portion 10E is a portion of the peripheral area 10D which does not contribute to the thin film capacitor Cs, even though the dielectric layer 31 is subjected to damage (for example, the dielectric layer 31 is burnt by the laser processing) in the roughness degradation process and the upper conductive layer 41 and the lower conductive layer 42 are physically connected to each other and are electrically shorted, problems do not occur.

(Seventh Embodiment)

Figure 29:
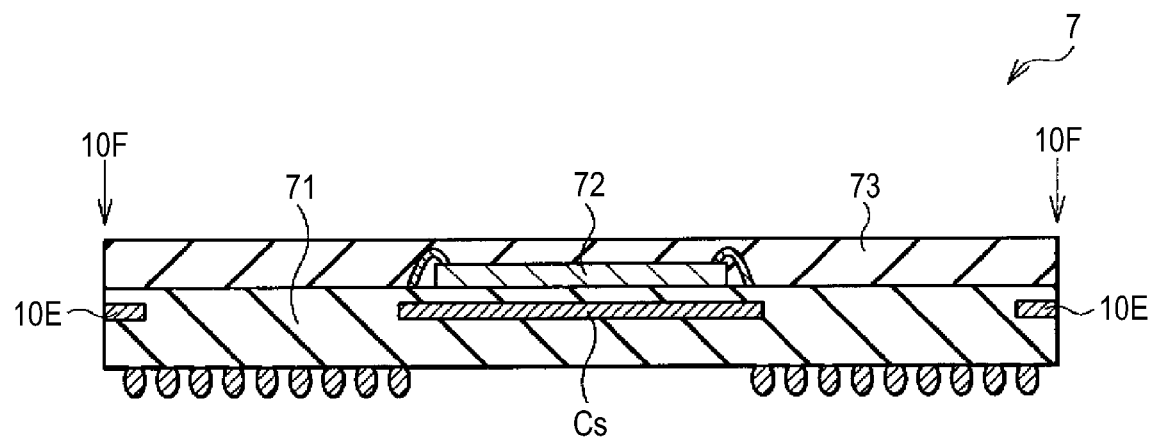
FIG. 29 is a cross-sectional view showing a configuration of a multilayer wiring board according to a seventh embodiment of the present disclosure.

FIG. 29 shows a cross-sectional configuration of a multilayer wiring board according to a seventh embodiment of the present disclosure. For example, this multilayer wiring board 7 is used as an interposer substrate and includes a substrate main body portion 71 in which the thin film capacitor Cs of the first embodiment is embedded. For example, in the substrate main body portion 71, the mooring portion 10E similar to the first or the sixth embodiment is provided along the outline 10F.

A semiconductor device 72 is mounted on the upper surface of the substrate main body portion 71 above the thin film capacitor Cs. The upper surface of the substrate main body portion 71 on which the semiconductor device 72 is mounted is covered by a protective film 73.

Figure 30:
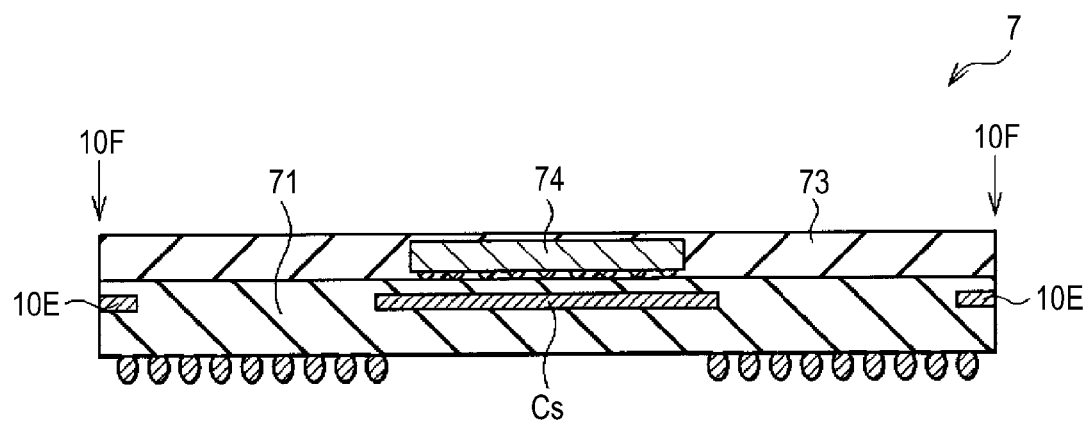
FIG. 30 is a cross-sectional view illustrating a modification of the multilayer wiring board shown in FIG. 29.

Moreover, as shown in FIG. 30, instead of the semiconductor device 72, an IC chip 74 or the like may be mounted.

For example, this multilayer wiring board 7 may be manufactured similar to the first embodiment or the third to the fifth embodiments and the operation and the effects are similar to those of the first or the sixth embodiment.

(Eighth Embodiment)

Figure 31:
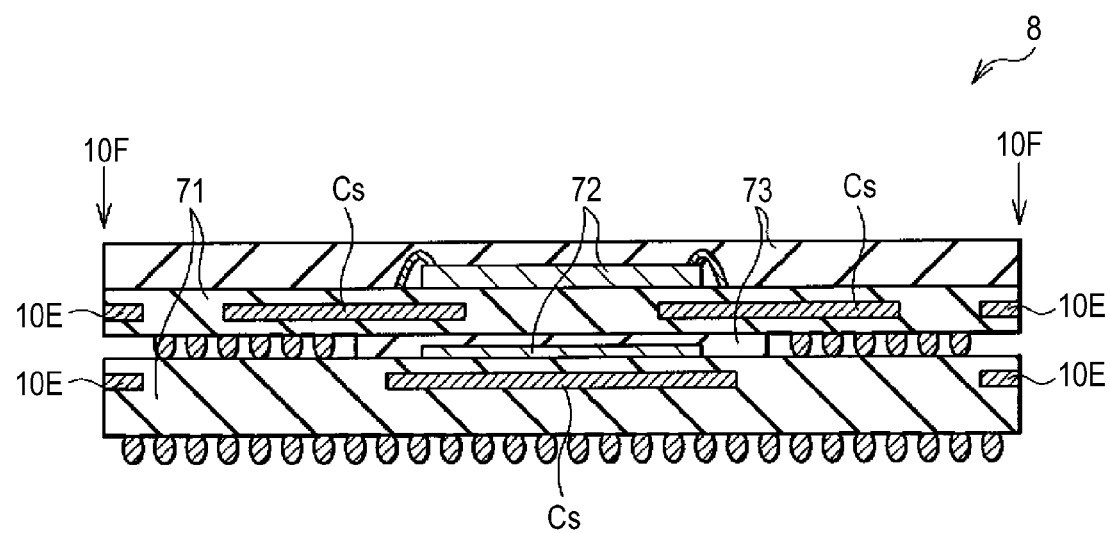
FIG. 31 is a cross-sectional view showing a configuration of a multilayer wiring board according to an eighth embodiment of the present disclosure.

FIG. 31 shows a cross-sectional configuration of a multilayer wiring board according to an eighth embodiment of the present disclosure. For example, the multilayer wiring board 8 is an interposer substrate referred to as a PoP having a configuration which is superposed in multiple stages, and has a configuration in which the multilayer wiring boards 7 according to the seventh embodiment are superposed in a plurality of layers (for example, two layers in FIG. 31).

In the present embodiment, the wiring distance between the semiconductor device 72 and the thin film capacitor Cs which is embedded in the substrate main body portion 71 of the multilayer wiring board 7 can be minimized, and the inductance of the entire package when viewed from the semiconductor device 72 can be decreased.

(Ninth Embodiment)

FIG. 32 shows a configuration of a semiconductor device according to a ninth embodiment of the present disclosure. In the semiconductor device 9, for example, a DC/DC power supply circuit 91, a bulk chip 92, and the multilayer wiring board 8 according to the eighth embodiment which is an interposer substrate are mounted on a main board 80. The main board 80 is a printed circuit board having a configuration in which the first wiring layer (GND) L1 and the second wiring layer (power supply wiring) L2 are laminated to each other while interposing resist layers 81, 82 and 83. In the inner portion of the main board 80, the thin film capacitor Cs and the mooring portion 10E according to the first or the sixth embodiment include the first wiring layer L1, the second wiring layer L2, and the resin layer 82 between the first wiring layer L1 and the second wiring layer L2.

In the semiconductor device, since the main board 80 includes the multilayer wiring board of the above-described embodiments or modifications, the peeling at the interface between the upper electrode 21 or the lower electrode 22 of the thin film capacitor Cs and the dielectric layer 31 in the functional area 10C is suppressed, and therefore, the life span of the product is lengthened.

As described above, the present disclosure is described with reference to the embodiments. However, the present disclosure is not limited thereto and various modifications may be applied. For example, in the above-described embodiments, the case where the mooring portion 10E is provided in a portion of the peripheral area 10D is described. However, the mooring portion 10E may be provided at least on a portion of the peripheral portion 10D. For example, the mooring portion 10E may be provided on the entire peripheral area 10D.

Moreover, in the above-described embodiments, the case where the mooring portion 10E includes the configuration in which the dielectric layer 31 is laminated between the upper conductive layer 41 and the lower conductive layer 42 is described. However, the mooring portion 10E may include a configuration in which the dielectric layer 31 and the lower conductive layer 42 are laminated to each other and the surface of the lower conductive layer 42 which contacts the dielectric layer 31 may be the coarse surface portion 43. In addition, the mooring portion 10E may includes a configuration in which the dielectric layer 31 and the upper conductive layer 41 are laminated to each other and the surface of the upper conductive layer 41 which contacts the dielectric layer 31 may be the coarse surface portion 43.

Moreover, for example, in the above-described embodiments, the configuration of the multilayer wiring board or the semiconductor device is specifically described. However, all components may be not provided and other components may be further provided.

The present disclosure may be implemented as the following configurations.

(1) A multilayer wiring board including a functional area which includes a thin film capacitor having a dielectric layer between an upper electrode and a lower electrode; and a peripheral area other than the functional area, wherein a mooring portion in which the dielectric layer and a conductive layer are laminated is provided in at least a portion of the peripheral area, and a roughness of a surface of the conductive layer which contacts the dielectric layer is greater than a roughness of a surface of the upper electrode or the lower electrode which contacts the dielectric layer.

(2) In the multilayer wiring board according to (1), the dielectric layer may be provided as a common layer of the functional area and the peripheral area.

(3) In the multilayer wiring board according to (1) or (2), the mooring portion may be provided along an outline.

(4) In the multilayer wiring board according to any one of (1) to (3), a through-hole may be provided in the peripheral area, and the mooring portion may be provided so as to enclose the through-hole.

(5) In the multilayer wiring board according to any one of (1) to (4), the mooring portion may include the dielectric layer between the upper conductive layer and the lower conductive layer, and the upper conductive layer and the lower conductive layer may penetrate the dielectric layer and may be physically connected to each other.

(6) A method of manufacturing a multilayer wiring board including, degrading a roughness of a portion of a surface of a metallic foil; laminating a dielectric layer and a conductive material layer on a surface of the metallic foil in this order; forming a lower electrode of a thin film capacitor and forming a mooring portion on which the dielectric layer and a lower conductive layer are laminated in an area in which the roughness is degraded, by molding the metallic foil; and forming an upper electrode of the thin film capacitor by molding the conductive material layer.

(7) The method of manufacturing a multilayer wiring board according to (6), may further include, improving a roughness of an area which becomes at least the lower electrode in the surface of the metallic foil before degrading the roughness of a portion of the surface of the metallic foil.

(8) In the method of manufacturing a multilayer wiring board according to (6) or (7), laser processing may be used as a method which degrades the roughness.

(9) In the method of manufacturing a multilayer wiring board according to (6) or (7), coarsening processing by a chemical solution may be used as a method which degrades the roughness.

(10) A method of manufacturing a multilayer wiring board including, laminating a dielectric layer and a conductive material layer on a surface of a metallic foil in this order; degrading a roughness of a portion of a surface of the metallic foil or the conductive material layer which contacts the dielectric layer by laser processing; forming a lower electrode of a thin film capacitor and forming a mooring portion on which the dielectric layer and a lower conductive layer are laminated in an area in which the roughness is degraded, by molding the metallic foil; and forming an upper electrode of the thin film capacitor and forming an upper conductive layer on the mooring portion, by molding the conductive material layer.

(11) A method of manufacturing a multilayer wiring board including, laminating a dielectric layer and a conductive material layer on a surface of a metallic foil in this order; forming a lower electrode of a thin film capacitor and forming a mooring portion in which the dielectric layer and the lower conductive layer are laminated, by molding the metallic foil; degrading a roughness of a surface of the lower conductive layer or the conductive material layer which contacts the dielectric layer in the mooring portion by laser processing; and forming an upper electrode of the thin film capacitor by molding the conductive material layer.

(12) A method of manufacturing a multilayer wiring board including, laminating a dielectric layer and a conductive material layer on a surface of a metallic foil in this order; forming a lower electrode of a thin film capacitor and forming a mooring portion in which the dielectric layer and the lower conductive layer are laminated, by molding the metallic foil; forming an upper electrode of the thin film capacitor and forming an upper conductive layer on the mooring portion, by molding the conductive material layer; and degrading a roughness of a surface of the upper conductive layer or the lower conductive layer which contacts the dielectric layer in the mooring portion by laser processing.

(13) A multilayer wiring board including a functional area which includes a thin film capacitor having a dielectric layer between an upper electrode and a lower electrode, and a peripheral area other than the functional area, wherein a mooring portion including the dielectric layer between an upper conductive layer and a lower conductive layer is provided in at least a portion of the peripheral area, and the upper conductive layer and the lower conductive layer penetrate the dielectric layer and are physically connected to each other.

(14) A method of manufacturing a multilayer wiring board including, laminating a dielectric layer and a conductive material layer on a surface of a metallic foil in this order; penetrating the dielectric layer by laser processing and physically connecting the metallic foil and the conductive material layer to each other; forming a lower electrode of a thin film capacitor and forming a mooring portion in which the dielectric layer and a lower conductive layer are laminated in an area in which the metallic foil and the conductive material layer are physically connected, by molding the metallic foil; and forming an upper electrode of the thin film capacitor and forming an upper conductive layer in the mooring portion, by molding the conductive material layer.

(15) A method of manufacturing a multilayer wiring board including, laminating a dielectric layer and a conductive material layer on a surface of a metallic foil in this order; forming a lower electrode of a thin film capacitor and forming a mooring portion in which the dielectric layer and a lower conductive layer are laminated, by molding the metallic foil; penetrating the dielectric layer by laser processing and physically connecting the lower conductive layer and the conductive material layer in the mooring portion to each other; and forming an upper electrode of the thin film capacitor and forming an upper conductive layer in the mooring portion, by molding the conductive material layer.

(16) A method of manufacturing a multilayer wiring board including, laminating a dielectric layer and a conductive material layer on a surface of a metallic foil in this order; forming a lower electrode of a thin film capacitor and forming a mooring portion in which the dielectric layer and a lower conductive layer are laminated, by molding the metallic foil; forming an upper electrode of the thin film capacitor and forming an upper conductive layer in the mooring portion, by molding the conductive material layer; and penetrating the dielectric layer by laser processing and physically connecting the upper conductive layer and the lower conductive layer in the mooring portion to each other.

(17) A semiconductor device including a chip and a multilayer wiring board, wherein the multilayer wiring board includes a functional area which includes a thin film capacitor having a dielectric layer between an upper electrode and a lower electrode, and a peripheral area other than the functional area, a mooring portion in which the dielectric layer and a conductive layer are laminated is provided in at least a portion of the peripheral area, and a roughness of a surface of the conductive layer which contacts the dielectric layer is greater than a roughness of a surface of the upper electrode or the lower electrode which contacts the dielectric layer.

(18) A semiconductor device including a chip and a multilayer wiring board, wherein the multilayer wiring board includes a functional area which includes a thin film capacitor having a dielectric layer between an upper electrode and a lower electrode, and a peripheral area other than the functional area, a mooring portion including the dielectric layer between an upper conductive layer and a lower conductive layer is provided in at least a portion of the peripheral area, and the upper conductive layer and the lower conductive layer penetrate the dielectric layer and are physically connected to each other.

The present disclosure contains subject matter related to that disclosed in Japanese Priority Patent Application JP 2011-124604 filed in the Japan Patent Office on Jun. 2, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A multilayer wiring board comprising:
   a substrate with a substrate area serving as a printed wiring board or an interposer substrate and a machining area on which physical machining, cutting such as dicing, or routering are to be performed, the substrate area including a functional area with one or more functional electrical components and a peripheral area without a functional electrical component located outside of the functional area;
   in the functional area, a thin film capacitor comprising a first electrode, a second electrode and a thin film capacitor dielectric layer in-between the first and second electrodes; and
   a mooring portion outside of the functional area comprising a lamination of the dielectric layer, a first conductive layer which is a portion of a same layer as the first electrode, and a second conductive layer which is a portion of a same layer as the second electrode, the mooring portion being within at least a portion of the peripheral area and abutting a boundary line separating the machining area and the substrate area,
   wherein,
      a surface roughness of a surface of the second conductive layer facing the dielectric layer in the mooring portion is greater than a surface roughness of a surface of the second electrode facing the dielectric in the functional area.

2. The multilayer wiring board according to claim 1, wherein a through-hole is provided in the peripheral area, and the mooring portion encloses the through-hole.

3. The multilayer wiring board according to claim 1, wherein:
   the first conductive layer is located below the dielectric layer,
   the second conductive layer is located above the dielectric layer, and
   the second conductive layer and the first conductive layer each penetrate the dielectric layer and are physically connected to each other and shorted.

4. A multilayer wiring board comprising:
   a substrate with a substrate area serving as a printed wiring board or an interposer substrate and a machining area on which physical machining, cutting such as dicing, or routering are to be performed, the substrate area including a functional area with one or more function electrical components and a peripheral area without a functional electrical component located outside of the functional area;
   in the functional area, a thin film capacitor comprising a first electrode, a second electrode, and a thin film capacitor dielectric layer in-between the first electrode and the second electrode; and
   in at least a portion of the peripheral area and abutting a boundary line separating the machining area and the substrate area, a mooring portion including the dielectric layer in-between an first conductive layer which is a portion of a same layer as the first electrode and a second conductive layer which is a portion of a same layer as the second electrode,
   wherein,
   the first conductive layer and the second conductive layer each penetrate the dielectric layer and are physically connected to each other in the mooring portion and shorted, and
   a surface roughness of a surface of the second conductive layer facing the dielectric layer in the mooring portion is greater than a surface roughness of a surface of the second conductive layer facing the dielectric layer in the functional area.

5. A semiconductor device comprising:
a chip; and
a multilayer wiring board,
wherein the multilayer wiring board includes
- (a) a substrate with a substrate area serving as a printed wiring board or an interposer substrate and a machining area on which physical machining, cutting such as dicing, or routering are to be performed, the substrate area including a functional area with one or more functional electrical components and a peripheral area without a functional electrical component located outside of the functional area,
- (b) in the functional area, a thin film capacitor comprising a first electrode, a second electrode and a thin film capacitor dielectric layer in-between the first electrode and the second electrode, and
- (c) a mooring portion comprising a lamination of a first conductive layer which is a portion of a same layer as the first electrode, the dielectric layer, and a second conductive layer which is a portion of a same layer as the second electrode, the mooring portion being outside the functional area and abutting a boundary line separating the machining area and the substrate area, and wherein,
a surface roughness of a surface of the first conductive layer in contact with the dielectric layer in the mooring portion is greater than a surface roughness of a surface of the first electrode in contact with the dielectric layer in the functional portion.

6. A semiconductor device comprising:
a chip; and
a multilayer wiring board,
wherein the multilayer wiring board includes:
- (a) a substrate with a substrate area serving as a printed wiring board or an interposer substrate and a machining area on which physical machining, cutting such as dicing, or routering are to be performed, the substrate area including a functional area with one or more functional electrical components and a peripheral area without a functional electrical component located outside of the functional area,
- (b) in the functional area, a thin film capacitor comprising a first conductive layer, a second conductive layer, and a thin film capacitor dielectric layer in-between the first electrode and the second electrode, and
- (c) a mooring portion comprising a lamination of a first conductive layer which is a portion of a same layer as the first electrode, the dielectric layer, and a second conductive layer which is a portion of a same layer as the second electrode, the mooring portion being outside the functional peripheral area and abutting a boundary line separating the machining area and the substrate area, and wherein,
the first conductive layer and the second conductive layer penetrate the dielectric layer and are physically connected to each other in the mooring portion and shorted, and
a surface roughness of a surface of the first conductive layer facing the dielectric layer in the mooring portion is greater than a surface roughness of a surface of the first electrode facing the dielectric layer in the functional area.

* * * * *